United States Patent
Domino

(10) Patent No.: US 10,056,925 B2
(45) Date of Patent: *Aug. 21, 2018

(54) CARRIER AGGREGATION SYSTEMS AND METHODS

(71) Applicant: SKYWORKS SOLUTIONS, INC., Woburn, MA (US)

(72) Inventor: William J. Domino, Yorba Linda, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/413,214

(22) Filed: Jan. 23, 2017

(65) Prior Publication Data

US 2017/0230068 A1 Aug. 10, 2017

Related U.S. Application Data

(63) Continuation of application No. 14/838,761, filed on Aug. 28, 2015, now Pat. No. 9,553,619.

(60) Provisional application No. 62/044,169, filed on Aug. 29, 2014.

(51) Int. Cl.
| | |
|---|---|
| *H04M 1/00* | (2006.01) |
| *H04B 1/04* | (2006.01) |
| *H04B 1/00* | (2006.01) |
| *H04W 72/04* | (2009.01) |
| *H03F 3/19* | (2006.01) |
| *H03F 1/56* | (2006.01) |

(52) U.S. Cl.
CPC ............. *H04B 1/0483* (2013.01); *H03F 1/56* (2013.01); *H03F 3/19* (2013.01); *H04B 1/005* (2013.01); *H04W 72/0453* (2013.01); *H03F 2200/111* (2013.01); *H03F 2200/222* (2013.01); *H03F 2200/294* (2013.01); *H03F 2200/451* (2013.01)

(58) Field of Classification Search
CPC ......... H04B 1/0483; H04B 1/005; H03F 1/56; H03F 2200/451; H04W 72/0453
USPC ............. 455/552.1, 73, 550.1, 60, 61, 553.1
See application file for complete search history.

(56) References Cited

U.S. PATENT DOCUMENTS

| | | | |
|---|---|---|---|
| 6,249,687 B1 | 6/2001 | Thomsen et al. | |
| 8,384,494 B2 | 2/2013 | Laporte et al. | |
| 8,412,139 B2 * | 4/2013 | Park ................... | H04L 27/2647 455/207 |

(Continued)

OTHER PUBLICATIONS

International Search Report and Written Opinion for PCT/US2015/047378 dated Dec. 15, 2015.

*Primary Examiner* — Sonny Trinh
(74) *Attorney, Agent, or Firm* — Chang & Hale LLP

(57) ABSTRACT

Carrier aggregation systems and methods are disclosed. In some embodiments, a radio-frequency circuit can include a first signal path configured to present an approximately zero impedance to a first out-of-band signal that is out of a first frequency band. The radio-frequency circuit can further include a coupling circuit coupled to the first signal path and configured such that the approximately zero impedance presented by the first signal path to the first out-of-band signal results in the first out-of-band signal being substantially excluded from the first signal path. The radio-frequency circuit can further include a second signal path configured to present an approximately zero impedance to a second out-of-band signal that is out of a second frequency band.

20 Claims, 27 Drawing Sheets

(56) References Cited

U.S. PATENT DOCUMENTS

| | | | |
|---|---|---|---|
| 8,498,666 B2* | 7/2013 | Sebire | H04L 5/001 |
| | | | 370/351 |
| 8,565,700 B2* | 10/2013 | Lee | H04L 5/001 |
| | | | 455/132 |
| 8,892,057 B2* | 11/2014 | Khlat | H04L 5/00 |
| | | | 370/277 |
| 9,154,356 B2 | 10/2015 | Tasic et al. | |
| 9,203,596 B2 | 12/2015 | Granger-Jones | |
| 9,553,619 B2* | 1/2017 | Domino | H03F 1/565 |
| 2002/0183016 A1 | 12/2002 | Kemmochi et al. | |
| 2011/0221643 A1 | 9/2011 | Rofougaran | |
| 2012/0007691 A1 | 1/2012 | Song | |
| 2012/0177147 A1* | 7/2012 | Park | H04L 27/2647 |
| | | | 375/316 |
| 2013/0099993 A1 | 4/2013 | Tung et al. | |
| 2016/0182094 A1* | 6/2016 | Hadji-Abdolhamid | |
| | | | H04B 1/0057 |
| | | | 455/88 |

* cited by examiner

CARRIER AGGREGATION SYSTEMS AND METHODS

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57. This application is a continuation of U.S. application Ser. No. 14/838,761 filed Aug. 28, 2015, entitled DOMINO CIRCUIT AND RELATED ARCHITECTURES AND METHODS FOR CARRIER AGGREGATION, which claims priority to and the benefit of the filing date of U.S. Provisional Application No. 62/044, 169 filed Aug. 29, 2014, entitled CIRCUITS AND METHODS RELATED TO CARRIER AGGREGATION, the benefits of the filing dates of which are hereby claimed and the disclosures of which are hereby expressly incorporated by reference herein in their entirety.

BACKGROUND

Field

The present disclosure relates to carrier aggregation in radio-frequency (RF) applications.

Description of the Related Art

In some radio-frequency (RF) applications, cellular carrier aggregation (CA) can involve two or more RF signals being processed through a common path. For example, carrier aggregation can involve use of a path for a plurality of bands having frequency ranges that are sufficiently separated. In such a configuration, simultaneous operation of more than one band can be achieved.

SUMMARY

In some implementations, the present disclosure relates to a radio-frequency (RF) circuit that includes a first signal path and a second signal path, with the first signal path being associated with a first frequency band, and the second signal path being associated with a second frequency band. The first signal path is configured to present an approximately zero impedance to a signal in the second frequency band, and the second signal path is configured to present an approximately zero impedance to a signal in the first frequency band. The signal in the second frequency band is different from the signal in the first frequency band. The RF circuit further includes a coupling circuit that couples the first and second signal paths. The coupling circuit is configured such that the approximately zero impedance presented by the first signal path to the signal in the second frequency band results in the signal in the second frequency band being substantially excluded from the first signal path, and such that the approximately zero impedance presented by the second signal path to the signal in the first frequency band results in the signal in the first frequency band being substantially excluded from the second signal path.

In some embodiments, each of the first and second signal paths can be further configured to present a matched impedance for a signal in the corresponding frequency band. The coupling circuit can be further configured such that the matched impedance of each signal path results in the corresponding signal to be included in the signal path.

In some embodiments, the RF circuit can be configured for carrier-aggregation (CA) of a received signal having portions in both of the first and second frequency bands. The coupling circuit can further include a common input node for the received signal. Each of the first and second signal paths can include a filter and a transmission line between a corresponding node of the coupling circuit and the filter. The filter can include a band-pass filter such as a surface acoustic wave (SAW) filter.

In some embodiments, the coupling circuit can include a first LC circuit and a second LC circuit that couple the common input node to ground in a parallel manner. The first LC circuit can include a first inductance L1 and a first capacitance C1 in series, and the second LC circuit can include a second capacitance C2 and a second inductance in series. An input of the first signal path can be at a node between L1 and C1, and an input of the second signal path can be at a node between C2 and L2.

In some embodiments, the RF circuit can further include a first grounding switch between the input of the first signal path and ground, and a second grounding switch between the input of the second signal path and ground. The first and second grounding switches can be configured to allow non-CA modes of operation. Each of the first and second grounding switches can be open for a CA mode of operation. The first grounding switch can be open and the second grounding switch can be closed for a non-CA operation in the first frequency band, and the second grounding switch can be open and the first grounding switch can be closed for a non-CA operation in the second frequency band.

In some embodiments, the matched impedance can have a value of approximately 50 Ohms. The first frequency band can include, for example, band B2, and the second frequency band include, for example, band B4. The first frequency band can further include, for example, band B25.

According to some implementations, the present disclosure relates to a radio-frequency (RF) circuit assembly that includes a common node associated with an aggregated signal including at least one first signal in a first frequency band and at least one second signal in a second frequency band. The RF circuit assembly further includes a first signal path and a second signal path, with the first signal path being associated with the first frequency band, the second signal path being associated with the second frequency band. The first signal path is configured to present an approximately zero impedance to the second signal, and the second signal path is configured to present an approximately zero impedance to the first signal. The RF circuit assembly further includes a coupling circuit that couples the first and second signal paths to the common node. The coupling circuit is configured such that the approximately zero impedance presented by the first signal path to the second signal results in the second signal being excluded from the first signal path, and the approximately zero impedance presented by the second signal path to the first signal results in the first signal being excluded from the second signal path.

In accordance with some implementations, the present disclosure relates to a radio-frequency (RF) circuit assembly that includes a first node associated with a first signal in a first frequency band and a second node associated with a second signal in a second frequency band. The RF circuit assembly further includes a first signal path coupled to the first node and associated with the first frequency band, and a second signal path coupled to the second node and associated with the second frequency band. The first signal path is configured to present an approximately zero impedance to the second signal, and the second signal path is configured to present an approximately zero impedance to the first signal. The RF circuit assembly further includes a coupling circuit that couples the first and second signal paths to a common node. The coupling circuit is configured such that the approximately zero impedance presented by the first signal path to the second signal results in the second signal being excluded from the first signal path and thereby directed to the common node, and the approximately zero impedance presented by the second signal path to the first signal results in the first signal being excluded from the second signal path and thereby directed to the common node.

In a number of teachings, the present disclosure relates to a method for processing radio-frequency (RF) signals. The method includes providing a first signal path and a second signal path, with the first signal path being associated with a first frequency band, and the second signal path being associated with a second frequency band. The method further includes presenting, at the first signal path, an approximately zero impedance to a signal in the second frequency band, and presenting, at the second signal path, an approximately zero impedance to a signal in the first frequency band. The signal in the second frequency band is different from the signal in the first frequency band. The method further includes coupling the first and second signal paths such that the approximately zero impedance presented by the first signal path to the signal in the second frequency band results in the signal in the second frequency band being substantially excluded from the first signal path, and such that the approximately zero impedance presented by the second signal path to the signal in the first frequency band results in the signal in the first frequency band being substantially excluded from the second signal path.

In a number of implementations, the present disclosure relates to a radio-frequency (RF) module that includes a packaging substrate configured to receive a plurality of components, and an RF circuit implemented on the packaging substrate. The RF circuit includes a first signal path and a second signal path, with the first signal path being associated with a first frequency band, and the second signal path being associated with a second frequency band. The first signal path is configured to present an approximately zero impedance to a signal in the second frequency band, and the second signal path is configured to present an approximately zero impedance to a signal in the first frequency band. The signal in the second frequency band is different from the signal in the first frequency band. The RF circuit further includes a coupling circuit that couples the first and second signal paths. The coupling circuit is configured such that the approximately zero impedance presented by the first signal path to the signal in the second frequency band results in the signal in the second frequency band being substantially excluded from the first signal path, and such that the approximately zero impedance presented by the second signal path to the signal in the first frequency band results in the signal in the first frequency band being substantially excluded from the second signal path.

In some embodiments, each of the first and second signal paths can include a filter and a transmission line between a corresponding node of the coupling circuit and the filter. The first and second filters can be configured to yield a diplexed output. The RF circuit can further include a low-noise amplifier (LNA) configured to operate in the first and second frequency bands, and have an input configured to receive the diplexed output of the first and second filters.

According to some teachings, the present disclosure relates to a wireless device that includes an antenna and a front-end module (FEM) in communication with the antenna. The FEM includes an RF circuit having a first signal path and a second signal path, with the first signal path being associated with a first frequency band, and the second signal path being associated with a second frequency band. The first signal path is configured to present an approximately zero impedance to a signal in the second frequency band, and the second signal path is configured to present an approximately zero impedance to a signal in the first frequency band. The signal in the second frequency band is different from the signal in the first frequency band. The RF circuit further includes a coupling circuit that couples the first and second signal paths. The coupling circuit is configured such that the approximately zero impedance presented by the first signal path to the signal in the second frequency band results in the signal in the second frequency band being substantially excluded from the first signal path, and such that the approximately zero impedance presented by the second signal path to the signal in the first frequency band results in the signal in the first frequency band being substantially excluded from the second signal path. The wireless device further includes a receiver in communication with the FEM and configured to process the signals in the first and second frequency bands.

In some implementations, the present disclosure relates to a radio-frequency (RF) circuit that includes a first signal path configured to present an approximately zero impedance at an input for a signal out of a first frequency band, and a second signal path configured to present an approximately zero impedance at an input for a signal out of a second frequency band. The RF circuit further includes a coupling circuit that couples the inputs of the first and second signal paths. The coupling circuit is configured such that the approximately zero impedance of each signal path results in the corresponding signal to be substantially excluded from the signal path.

In some embodiments, each of the first and second signal paths can be further configured to present a matched impedance for a signal in the corresponding frequency band. The coupling circuit can be further configured such that the matched impedance of each signal path results in the corresponding signal to be substantially included in the signal path. The signal out of the first frequency band can be in the second frequency band, and the signal out of the second frequency band can be in the first frequency band.

In some embodiments, the RF circuit can be configured for carrier-aggregation (CA) of a received signal having portions in both of the first and second frequency bands. The coupling circuit can further include a common input node for the received signal. Each of the first and second signal paths can include a filter and a transmission line between the corresponding input and the filter. The filter can include a band-pass filter such as a surface acoustic wave (SAW) filter.

In some embodiments, the approximately zero impedance of the corresponding signal path can be at least in part due a selected length of the transmission line. The coupling circuit can include a first LC circuit and a second LC circuit that couple the common input node to ground in a parallel manner. The first LC circuit can include a first inductance L1 and a first capacitance C1 in series, and the second LC circuit can include a second capacitance C2 and a second inductance L2 in series. The input of the first signal path can be at a node between L1 and C1, and the input of the second signal path can be at a node between C2 and L2.

In some embodiments, the RF circuit can further include a first grounding switch between the input of the first signal path and ground, and a second grounding switch between the input of the second signal path and ground. The first and second grounding switches can be configured to allow non-CA modes of operation. Each of the first and second grounding switches can be open for a CA mode of operation. The first grounding switch can be open and the second grounding switch can be closed for a non-CA operation in the first frequency band, and the second grounding switch can be open and the first grounding switch can be closed for a non-CA operation in the second frequency band.

In some embodiments, the matched impedance can have a value of approximately 50 Ohms. The first frequency band can include, for example, band B2, and the second frequency band can include, for example, band B4. The first frequency band can further include, for example, band B25.

According to some implementations, the present disclosure relates to a method for routing radio-frequency (RF) signals. The method includes presenting a band-dependent impedance at an input of a first signal path for a first frequency band and at an input of a second signal path for a second frequency band. The band-dependent impedance includes an approximately zero impedance for an out-of-band signal for each of the first and second frequency bands. The method further includes receiving an RF signal having the out-of-band signal for each of the first and second frequency bands. The method further includes excluding the out-of-band signal from each of the first and second signal paths based on the approximately zero impedance presented by the corresponding signal path.

In some embodiments, the band-dependent impedance can further include a matched impedance for an in-band signal for each of the first and second frequency bands. The method can further include allowing the in-band signal to pass to each of the first and second signal paths based on the matched impedance presented by the corresponding signal path.

In accordance with some teachings, the present disclosure relates to a carrier-aggregation (CA) system configured to exclude an out-of-band signal in each of a plurality of signal paths by an out-of-band impedance of approximately zero presented by the signal path.

In some embodiments, the CA system can be further configured to include an in-band signal in each of the plurality of signal paths by a matched in-band impedance presented by the signal path. The out-of-band impedance of approximately zero can be obtained by a net impedance adjustment based on a tendency of impedance change associated with a transmission property of the signal path. Each of the plurality of signal paths can include a band-pass filter. The tendency of impedance change can include a change towards a zero impedance from an impedance presented by the filter. The net impedance adjustment can yield an impedance of approximately zero for the signal path for the out-of-band signal. The approximately zero impedance of the signal path for the out-of-band signal can be obtained at least in part by a selected length of a transmission line associated with the filter.

In a number of implementations, the present disclosure relates to a radio-frequency (RF) module that includes a packaging substrate configured to receive a plurality of components, and an RF circuit implemented on the packaging substrate. The RF circuit includes a first signal path configured to present an approximately zero impedance at an input for a signal out of a first frequency band, and a second signal path configured to present an approximately zero impedance at an input for a signal out of a second frequency band. The RF circuit further includes a coupling circuit that couples the inputs of the first and second signal paths. The coupling circuit is configured such that the approximately zero impedance of each signal path results in the corresponding signal to be substantially excluded from the signal path.

In some embodiments, each of the first and second signal paths can include a filter and a transmission line between the corresponding input and the filter. The first and second filters can be configured to yield a diplexed output. The RF circuit can further include a low-noise amplifier (LNA) configured to operate in the first and second frequency bands, with the LNA having an input configured to receive the diplexed output of the first and second filters.

In some implementations, the present disclosure relates to a method for fabricating a radio-frequency (RF) module. The method includes providing or forming a packaging substrate configured to receive a plurality of components, and implementing an RF circuit on the packaging substrate. The RF circuit includes a first signal path configured to present an approximately zero impedance at an input for a signal out of a first frequency band, and a second signal path configured to present an approximately zero impedance at an input for a signal out of a second frequency band. The RF circuit further includes a coupling circuit that couples the inputs of the first and second signal paths. The coupling circuit is configured such that the approximately zero impedance of each signal path results in the corresponding signal to be substantially excluded from the signal path.

In some implementations, the present disclosure relates to a wireless device that includes a receiver configured to process RF signals, and a front-end module (FEM) in communication with the receiver. The FEM includes a carrier aggregation (CA) system having a first signal path configured to present an approximately zero impedance at an input for a signal out of a first frequency band, and a second signal path configured to present an approximately zero impedance at an input for a signal out of a second frequency band. The RF circuit further includes a coupling circuit that couples the inputs of the first and second signal paths. The coupling circuit is configured such that the approximately zero impedance of each signal path results in the corresponding signal to be substantially excluded from the signal path.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figure 1:
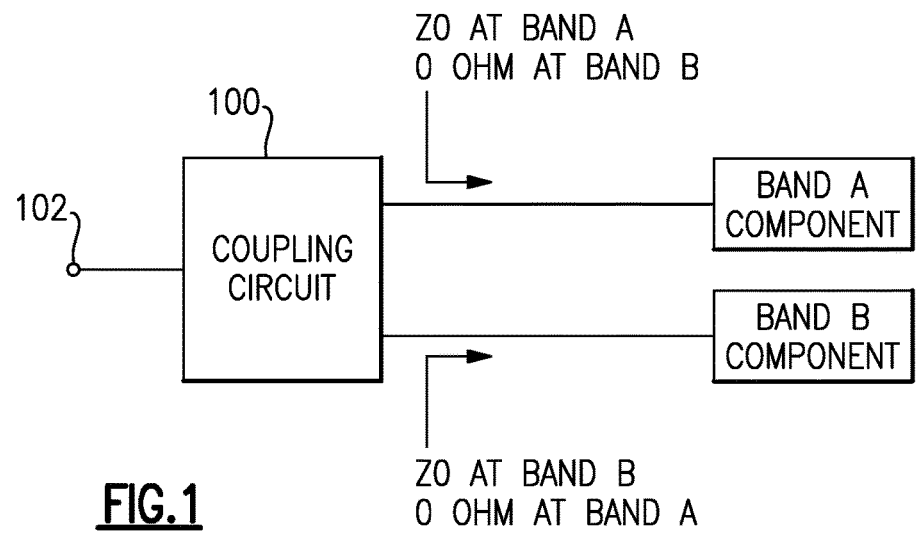
FIG. 1 shows a signal routing configuration where a coupling circuit can couple a common signal node to a first signal processing component and a second signal processing component.

FIG. 1 shows a signal routing configuration where a coupling circuit 100 can couple a common signal node 102 to a first signal processing component (Band A component) and a second signal processing component (Band B component). As described herein, such a coupling circuit can make use of band-dependent impedance that is presented by each of the Band A and Band B components. For the Band A component, the band-dependent impedance can include a matched impedance value Z0 (e.g., 50 Ohms) at Band A and approximately 0 Ohm impedance at Band B. For the Band B component, the band-dependent impedance can include a matched impedance value Z0 (e.g., 50 Ohms) at Band B and approximately 0 Ohm impedance at Band A. As described herein, such combinations of impedance values can allow the Band A and Band B components to operate alone individually, or together simultaneously. Although various examples are described herein in the context of matched impedance value (e.g., 50 Ohms) and 0 Ohm impedance value, it will be understood that one or more features of the present disclosure can also be implemented for other impedance values. It will also be understood that impedance values such as 50 Ohms and 0 Ohm can include values that are approximately 50 Ohms and 0 Ohm, respectively.

Figure 2:
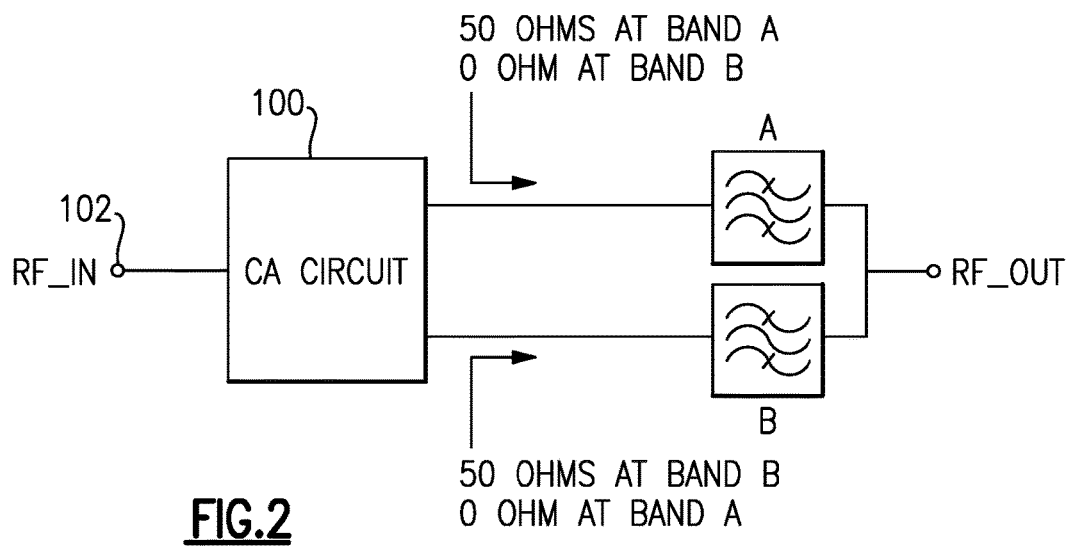
FIG. 2 shows a more specific example of the signal routing configuration of FIG. 1.

FIG. 2 shows a more specific example of the signal routing configuration of FIG. 1. FIG. 2 shows that in some embodiments, one or more features of the present disclosure can be implemented in carrier-aggregation (CA) application. Accordingly, the coupling circuit 100 of FIG. 1 can be a CA circuit 100, and the Band A and Band B components can be filters configured to provide band-pass functionality for Bands A and B.

FIG. 2 further shows that the CA circuit 100 and the filters can be arranged so that a radio-frequency (RF) signal can be provided at a common input node 102 (RF_IN) and be output at a common node RF_OUT. As described herein, the CA circuit 100 can allow band-dependent impedance to be presented between the CA circuit 100 and each of the A and B filters. For the A filter, the band-dependent impedance can be, for example, 50 Ohms at Band A and approximately 0 Ohm at Band B. For the B filter, the band-dependent impedance can be, for example, 50 Ohms at Band B and approximately 0 Ohm at Band A. Such combinations of impedance values can allow the A and B filters to operate alone individually, or together simultaneously, without affecting each other in a significant manner.

Figure 3:
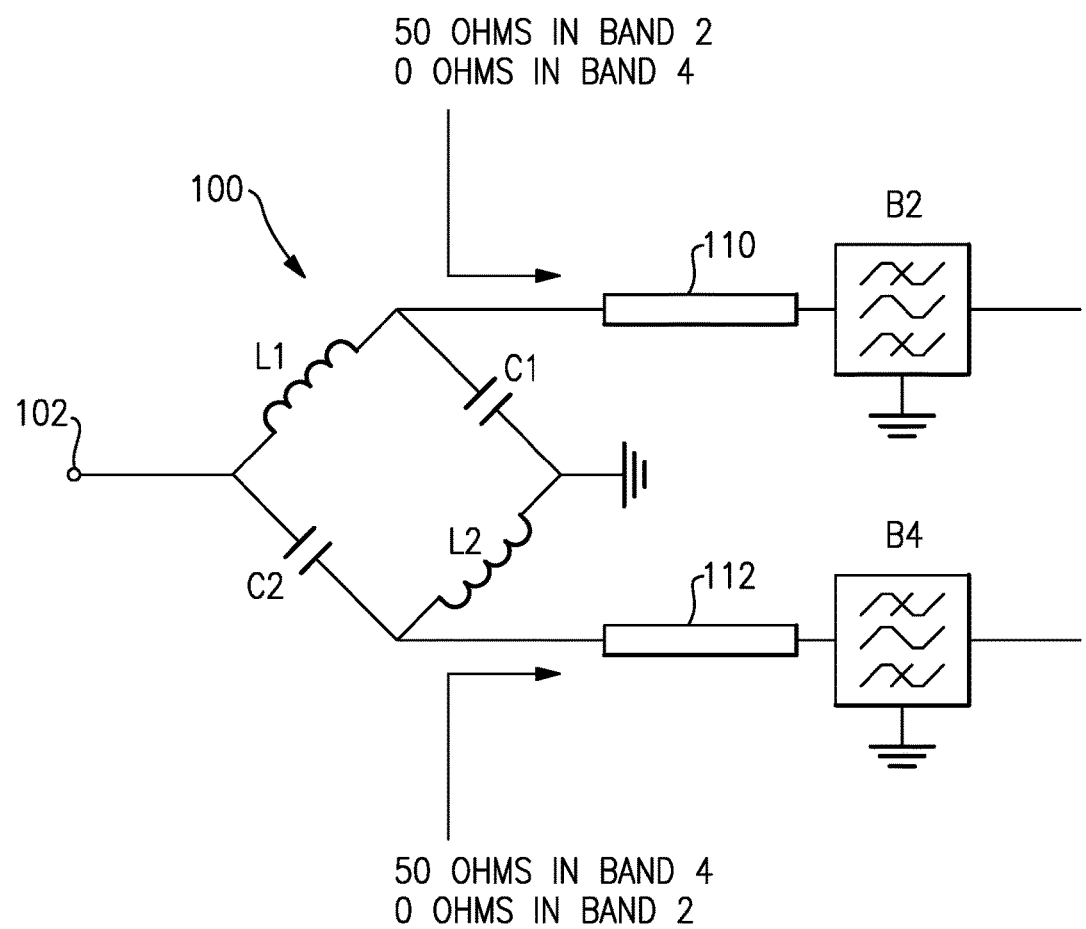
FIG. 3 shows a carrier-aggregation (CA) circuit that can be implemented as a more specific example of a CA circuit of FIG. 2.

FIG. 3 shows a CA circuit 100 that can be implemented as a more specific example of the CA circuit (100) described in reference to FIG. 2. In the example of FIG. 3, the CA circuit 100 can include two LC circuits that couple an input node 102 to ground. The first LC circuit can include a first inductance L1 (on the input side) in series with a first capacitance C1 (on the ground side). The second LC circuit can include a second capacitance C2 (on the input side) in series with a second inductance L2 (on the ground side). A node between L1 and C1 is shown to be coupled to a first band-pass filter through a transmission line depicted as 110. A node between C2 and L2 is shown to be coupled to a second band-pass filter through a transmission line depicted as 112.

In the example of FIG. 3, the first band-pass filter is indicated as being configured for operation in Band B2 (e.g., 1.930-1.990 GHz for Rx), and the second band-pass filter is indicated as being configured for operation in Band B4 (e.g., 2.110-2.155 GHz for Rx). In some examples described herein, the first band-pass filter can also operate in Band B25 (e.g., 1.930-1.995 GHz for Rx); accordingly, B2 and B2/B25 may be used interchangeably. While various examples are described in the context of such example bands, it will be understood that one or more features of the present disclosure can also be implemented for other combinations of bands.

In the example of FIG. 3, the CA circuit 100 can allow band-dependent impedance to be presented between the CA circuit 100 and each of the B2 and B4 filters. For the B2 filter, the band-dependent impedance can be, for example, approximately 50 Ohms at the B2 band and approximately 0 Ohm at the B4 band. For the B4 filter, the band-dependent impedance can be, for example, approximately 50 Ohms at the B4 band and approximately 0 Ohm at the B2 band. Such combinations of impedance values can allow the B2 and B4 filters to operate alone individually, or together simultaneously, without affecting each other in a significant manner.

The example CA circuit 100 of FIG. 3 can be considered to be a bridge circuit or a bridge-like circuit, in that two circuit branches in parallel are provided, with each branch having an intermediate node. In some embodiments, such intermediate nodes are not bridged by a third branch in the examples described herein. Accordingly, reference to the CA circuit 100 being a bridge circuit can be understood to include such a configuration.

FIGS. 4-14 show examples of various design considerations that can be noted in relation to the example CA circuit 100 of FIG. 3. In some RF applications, it can be desirable to diplex two filters in such a way to allow operation of either one or both filters. Preferably, such a configuration is implemented with little or no added loss, and with minimal hardware. When both filters are connected to produce an effective two-passband filter, it can used to receive a "carrier aggregation" ("CA") signal. Such functionality is required or desired in, for example, LTE, where signals from two separate bands are received at the same time, to create more usable bandwidth to achieve higher data rates.

Figure 4:
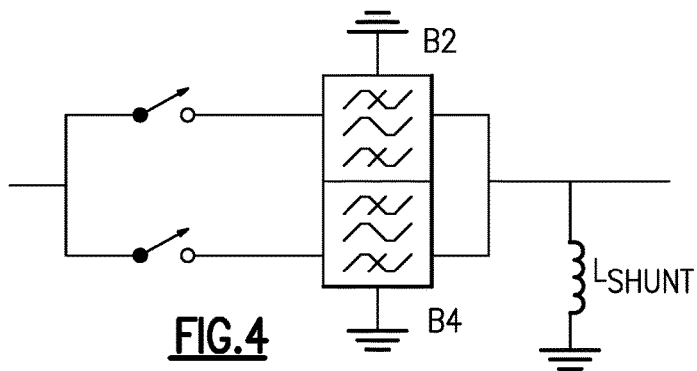
FIG. 4 shows an example of input switches that can be implemented for diplexed operation of two band-pass filters.

Referring to FIG. 4, input switches for the example B2 and B4 filters can be set to choose either or both filters for operation. However, there are significant issues to address when both filters are operated together in a diplexed manner.

Figure 5:
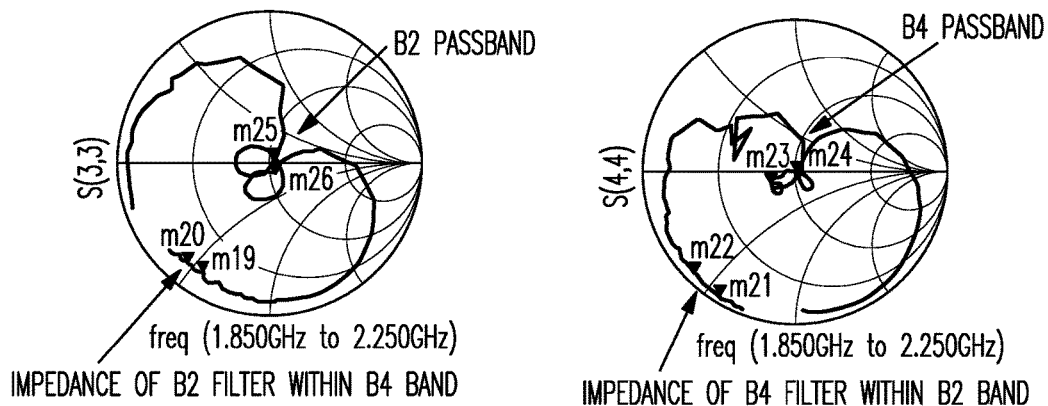
FIG. 5 shows typical responses of the band-pass filters of the example of FIG. 4.

Referring to FIG. 5, it is noted a typical band-pass filter such as a SAW filter exhibits a matched in-band impedance (e.g., at or near the center of a Smith chart), and an out-of-band impedance as shown. For example, and as shown in the left plot, the B2 filter exhibits a matched impedance (e.g., 50 Ohms) for a B2-band signal, and an out-of-band impedance for a B4-band signal. Similarly, and as shown in the right plot, the B4 filter exhibits a matched impedance (e.g., 50 Ohms) for a B4-band signal, and an out-of-band impedance for a B2-band signal.

Figure 6:
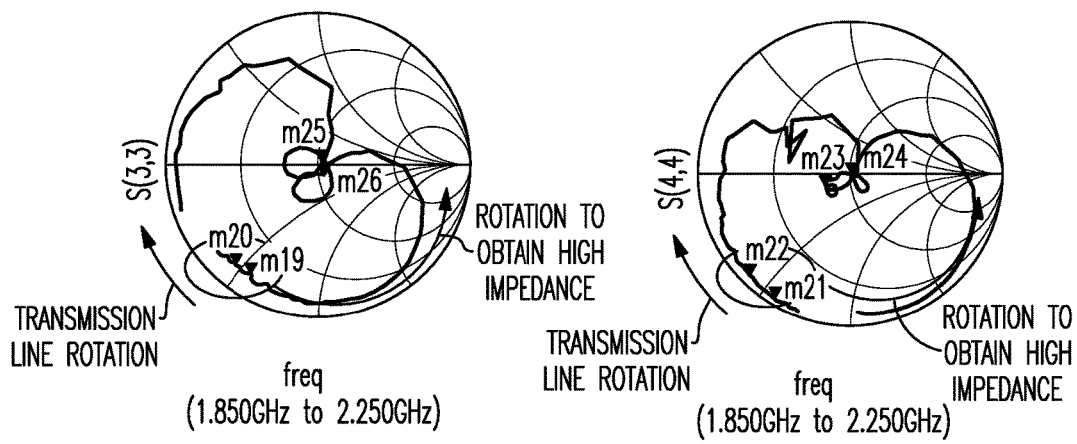
FIG. 6 shows an example where a CA configuration can be implemented to obtain a high impedance in an opposite band.

Referring to FIG. 6, a CA configuration can be implemented to obtain a high impedance in the opposite band. To obtain such a feature, phase shift can be introduced to effectively rotate each impedance plot until the opposite-band impedance preferably moves to the far-right point on a Smith chart, which is the infinite-impedance point. However when each filter is connected through a transmission line, the opposite-band impedance has a tendency to rotate the wrong way towards the zero impedance point on the Smith chart. It is noted that one could reach the infinite-impedance point by continuing the rotation with very long transmission lines. Such a rotation can involve, for example, about five times the transmission line rotation as shown, and the resulting transmission line will become too long physically. Such transmission lines can also be utilized instead of, for example, LC phase shifters. However, such transmission lines can be lengthy and may not be suitable for implementations in module formats.

Figure 8:
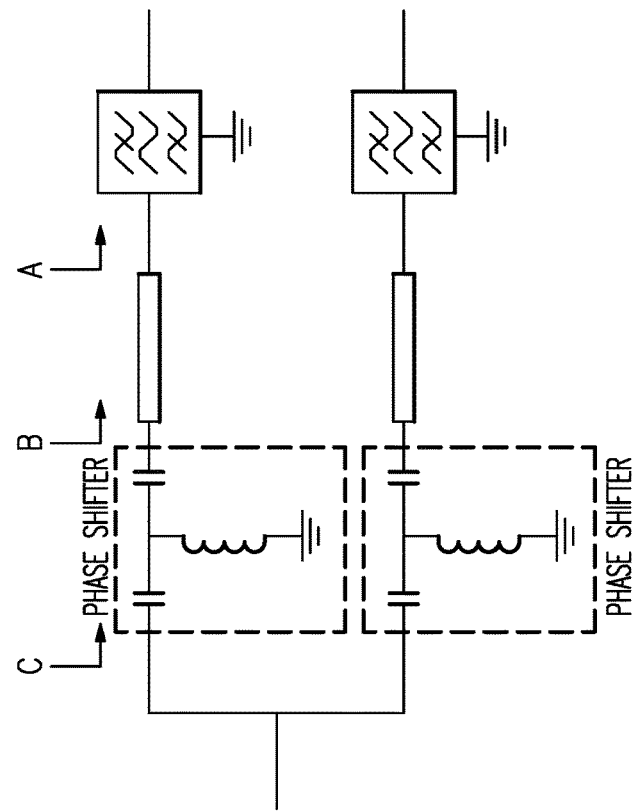
FIG. 8 shows an example where a phase shifter can be implemented to provide the phase shift of FIG. 7.
Figure 7:
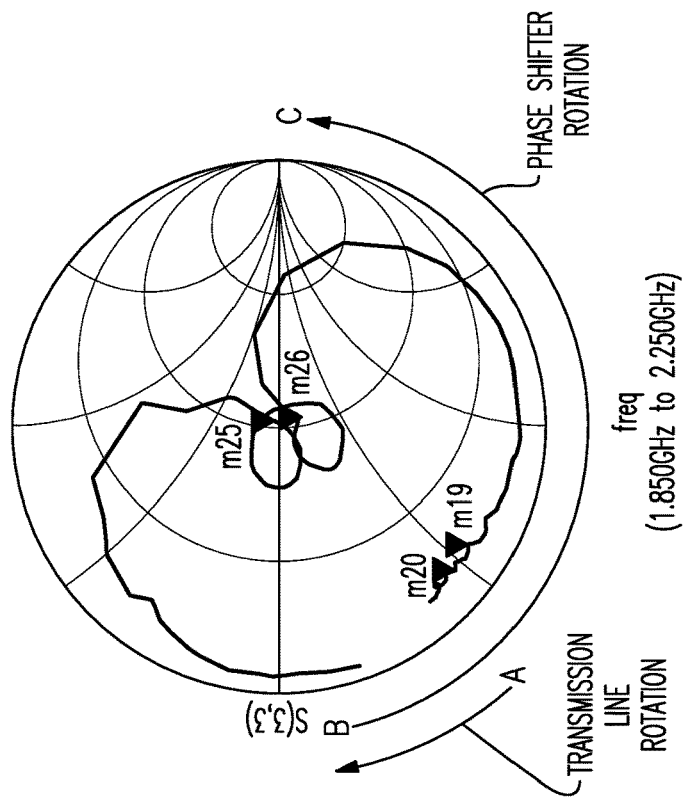
FIG. 7 shows an example where a phase shift can be utilized to rotate an impedance to a desired state.
Figure 9:
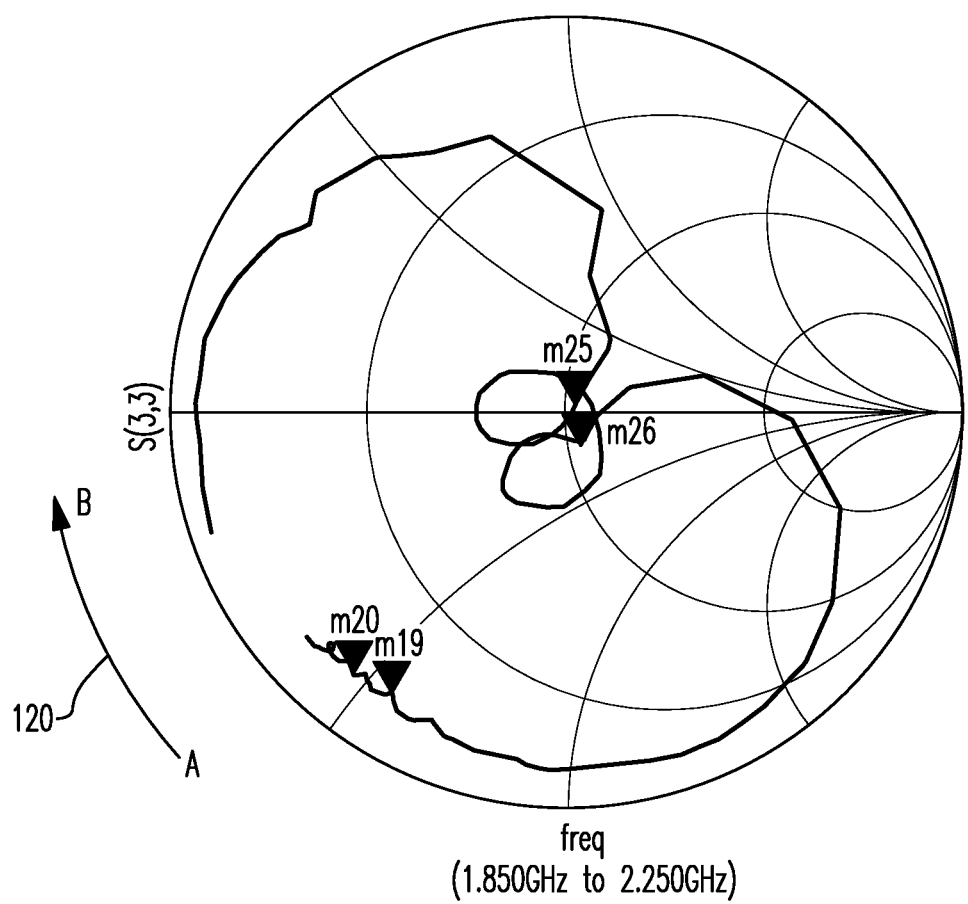
FIG. 9 shows that transmission lines utilized in some CA configurations have a tendency to rotate an out-of-band impedance to a low impedance.

Referring to FIGS. 7 and 8, a CA configuration can be implemented to include phase shifters that use, for example, series capacitors and shunt inductors. Such phase shifter can be configured to overcome the transmission line phase shift (e.g., manifested as rotation from A to B in FIG. 7), then rotate the impedance all the way to the desired high impedance (e.g., from B to C). Among others, additional details concerning such a CA configuration are described in U.S. Provisional Application No. 61/978,808 filed Apr. 11, 2014, entitled CIRCUITS AND METHODS RELATED TO RADIO-FREQUENCY RECEIVERS HAVING CARRIER AGGREGATION, and its corresponding U.S. application Ser. No. 14/683,512 filed Apr. 10, 2015, entitled CIRCUITS AND METHODS RELATED TO RADIO-FREQUENCY RECEIVERS HAVING CARRIER AGGREGATION, each of which is expressly incorporated by reference in its entirely, and which is to be considered part of the specification of the present application.

In some implementations, the present disclosure relates to a concept of utilizing a low out-of-band impedance for diplexing, instead of a high out-of-band impedance. As described in reference to FIGS. 6 and 7, and as further shown in FIG. 9, short transmission lines utilized in CA configurations have a tendency to rotate (arrow 120) a given filter's out-of-band impedance to a low impedance. Accordingly, one can utilize such a tendency instead of trying to rotate to the high impedance side.

In some embodiments, a CA configuration can include one filter exhibiting impedance that is zero or close to zero in the other filter's band. For such a configuration, one generally can not simply arrange the filter ports together in parallel. Instead, the filter ports can be arranged to effectively yield a series configuration. Arranged in such a manner, the out-of-band impedance being zero or close to zero allows a given filter to operate without being affected by the out-of-band impedance of the other filter in a significant manner.

Figure 10:
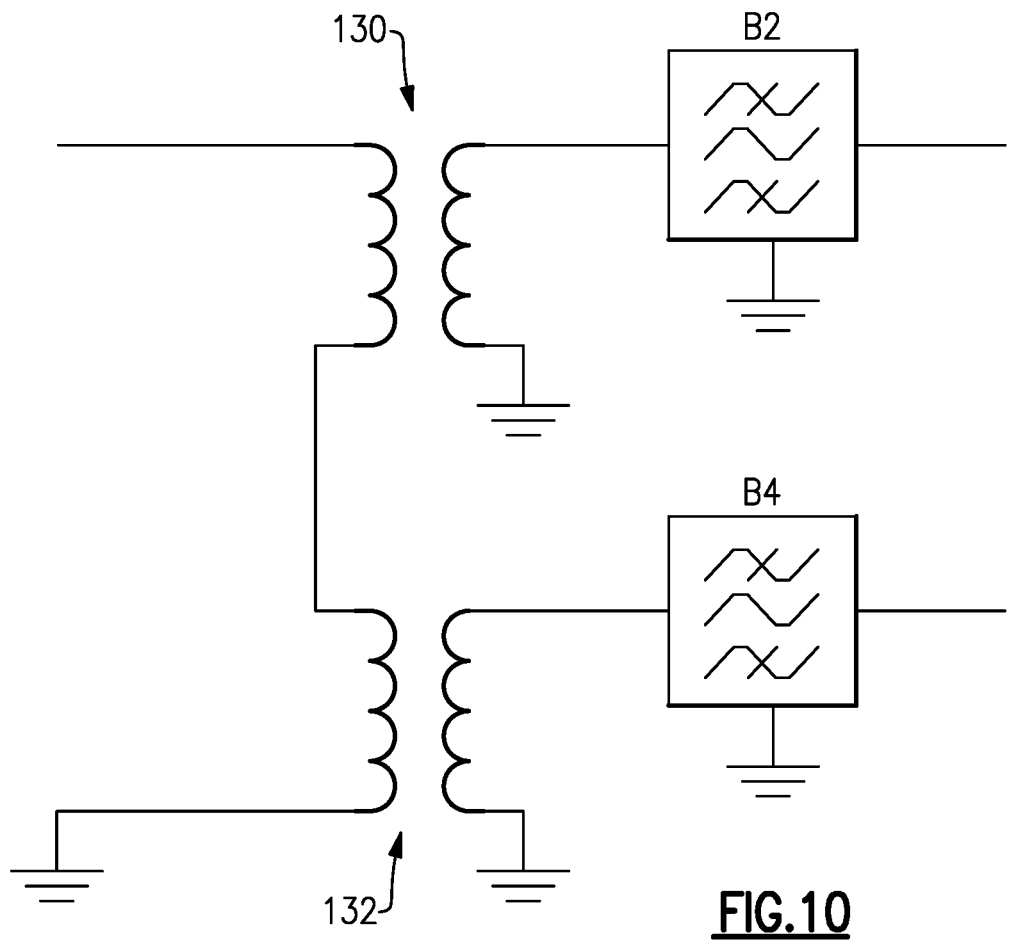
FIG. 10 shows an example where baluns can be utilized to provide balanced filter ports.

It is noted that balanced filter ports can be needed or desirable to yield the foregoing series configuration. It is also noted that many filters such as SAW filters are typically configured to provide single-ended ports, with each port configured for used with a single transmission line. Accordingly, in some embodiments, baluns 130, 132 can be implemented as shown in FIG. 10. In some embodiments, the baluns 130, 132 can be implemented as wirewound baluns. In some applications, however, such wirewound baluns may not be desirable.

Figure 11:
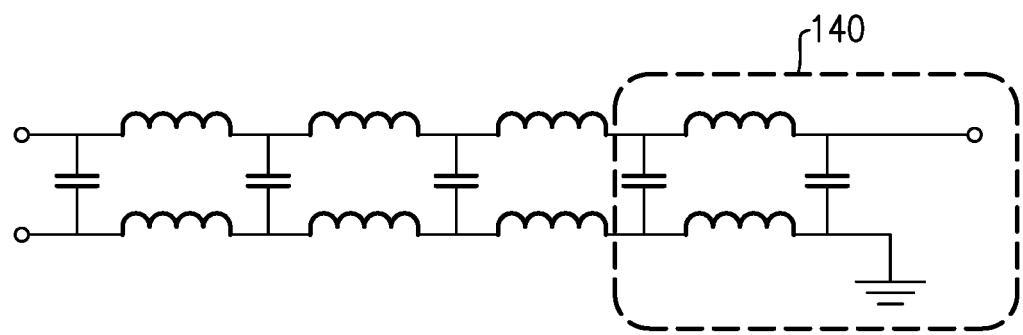
FIG. 11 shows an example of how a balanced transmission line can be modeled as a continuum of inductances and capacitances.

In some embodiments, lumped element baluns can be implemented, using LC approximation of a transmission line. Such a transmission line can be a balanced transmission line which can be modeled as a continuum of inductances and capacitances as shown as shown in FIG. 11. In such a model, matched impedance can be expressed as:

$$Z_0 = \sqrt{\frac{L}{C}}. \quad (1)$$

Such a balanced transmission line can work as a balun, by connecting one conductor to ground on one end.

In some embodiments, one section of the LC line model can replace each balun (130 or 132) of FIG. 10. In the example LC line model of FIG. 11, such a section is indicated as 140. Accordingly, FIG. 12 shows a CA configuration where first and second LC line sections 140a, 140b replace the first and second baluns 130, 132 of FIG. 10.

Figure 12:
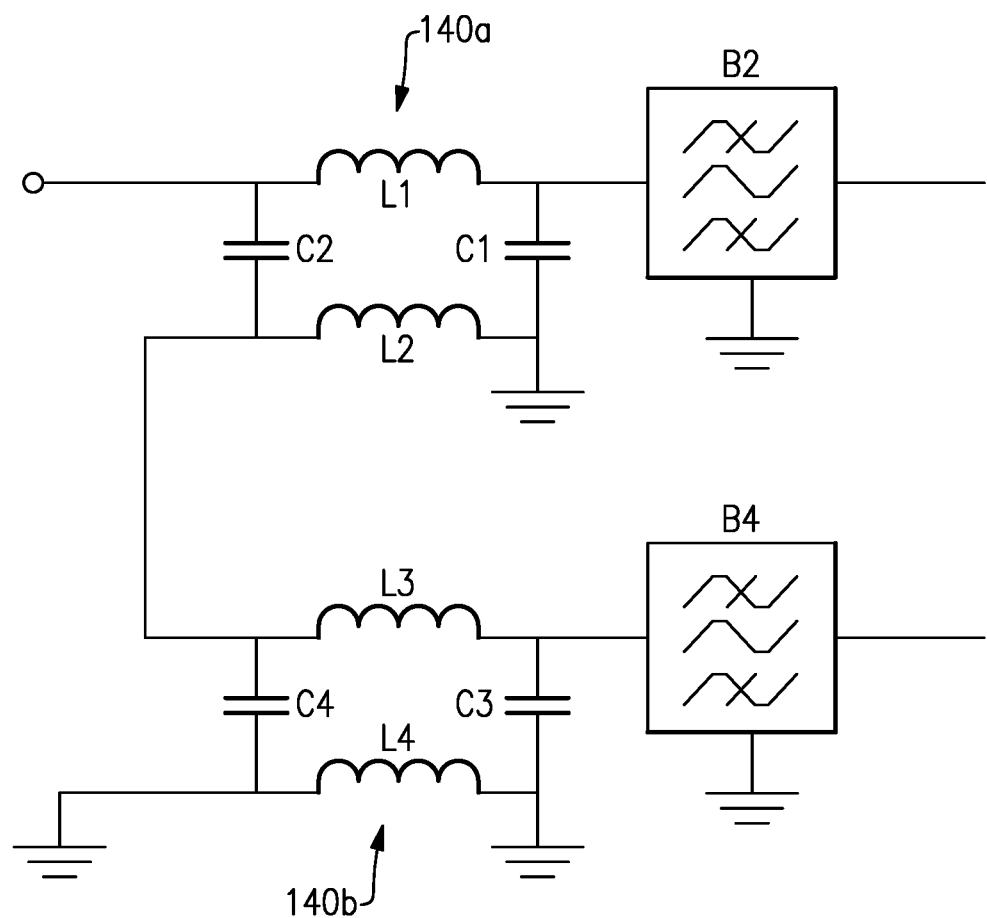
FIG. 12 shows an example CA configuration where each of the first and second baluns of FIG. 10 can be implemented as an assembly of LC circuits.

In the example of FIG. 12, an input node is shown to be coupled to ground through a first series combination of inductance L1 and capacitance C1, and also through a second series combination of capacitance C2 and inductance L2. A node between L1 and C1 is shown to be connected to the input of the B2 filter. A node between C2 and L2 is shown to be connected to a node between L3 and C4 of the second LC line section 140b. Such a node between L3 and C4 is shown to be coupled to ground through a first series combination of inductance L3 and capacitance C3, and also through a second series combination of capacitance C4 and inductance L4. A node between L3 and C3 is shown to be connected to the input of the B4 filter. A node between C4 and L4 is shown to be connected to ground.

Figure 13:
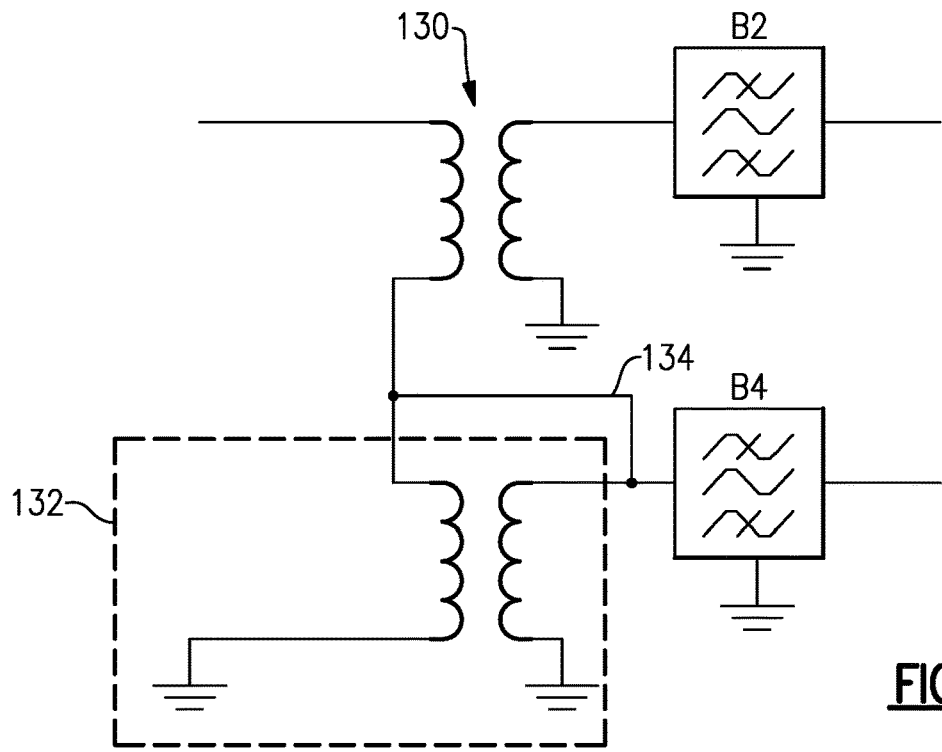
FIG. 13 shows an example where a balun in FIG. 10 can be removed and replaced by, for example, a connection.
Figure 14:
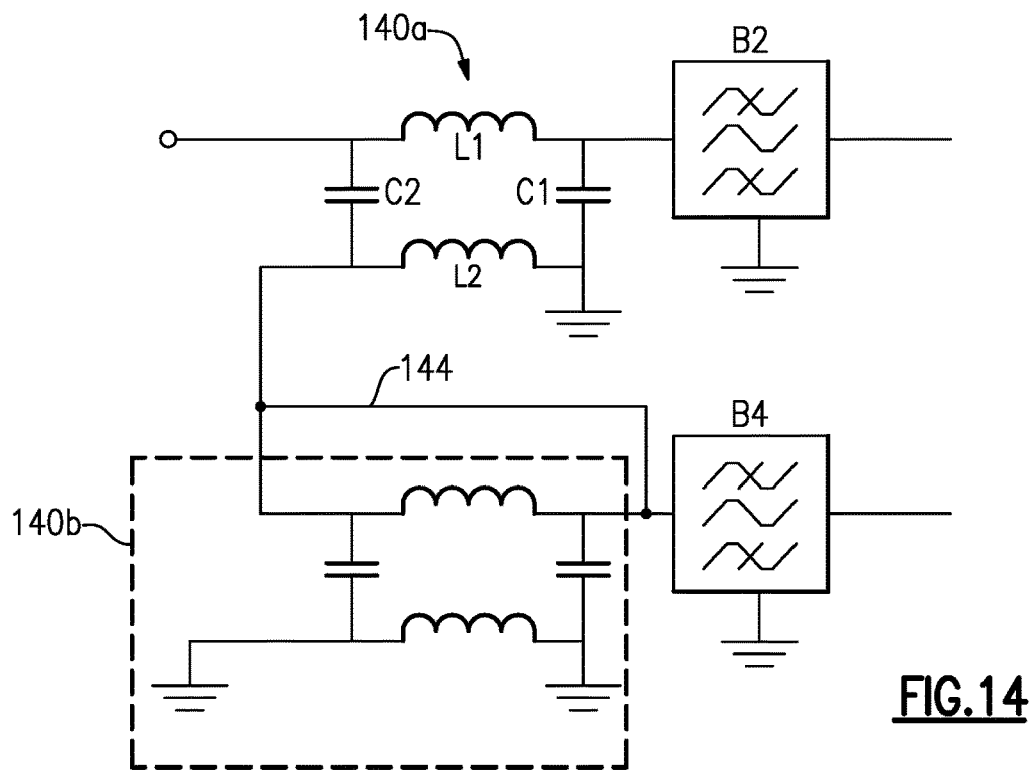
FIG. 14 shows an example where an assembly of LC circuits in FIG. 12 can be removed and replaced by, for example, a connection.

FIGS. 13 and 14 are similar to the examples of FIGS. 10 and 12, respectively. It is noted that each of the balun 132 and the LC line section 140b is single-ended on both sides, and thus provides 1:1 transformation functionality. Accordingly, such a balun/LC line section can be removed and replaced by, for example, a connection 134 for the balun configuration of FIG. 13, and a connection 144 for the LC line section configuration of FIG. 14.

In the example of FIG. 14, the foregoing removal of the LC line section 140b and addition of the connection 144 yields a configuration where the node between C2 and L2 of the first LC line section 140a is connected to the input of the B4 filter. One can see that such a configuration is essentially the same as the CA circuit 100 described herein in reference to FIG. 3.

It is noted that in the CA circuit 100 of FIG. 3, the node (between L1 and C1) connected to the input of the B2 filter essentially presents a short to ground for a signal in the B4 band. Similarly, the node (between C2 and L2) connected to the input of the B4 filter essentially presents a short to ground for a signal in the B2 band. Thus, an in-band portion of an input signal passes to the respective filter while an out-of-band portion of the input signal is routed to ground, to thereby facilitate a CA mode of operation.

Figure 15:
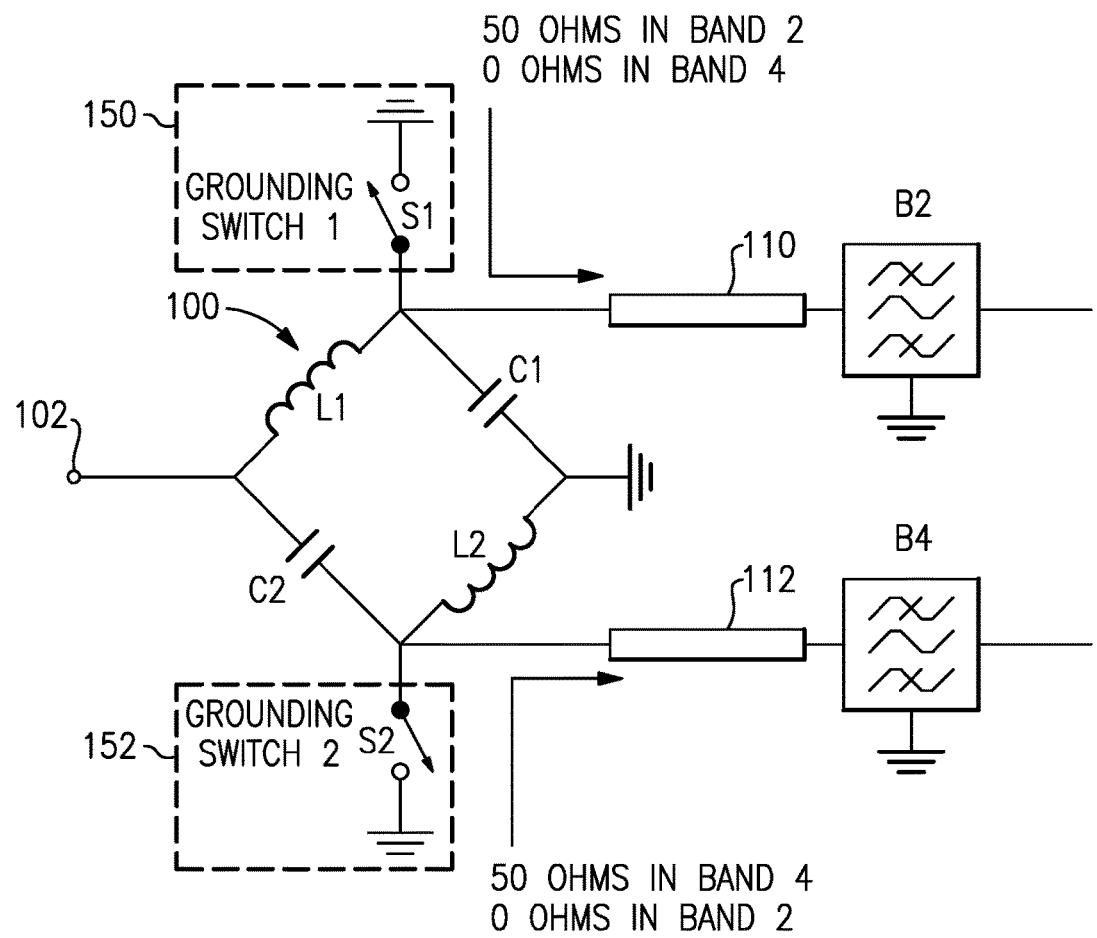
FIG. 15 shows a configuration where grounding switches can be implemented for the CA circuit to facilitate non-CA operations.

In some embodiments, the foregoing property of the CA circuit can be utilized to implement non-CA modes of operation in a simple manner. For example, FIG. 15 shows a configuration where grounding switches 150, 152 can be implemented for the CA circuit 100. More particularly, the first grounding switch 150 (S1) can switchably couple the node between L1 and C1 to ground. When S1 is opened, B2 in-band portion of an input signal passes to the B2 filter; and when S1 is closed, all of the input signal, including the B2 in-band portion, is grounded. Further, B4 out-of-band portion of the input signal is grounded regardless of the state of S1 as described herein.

Similarly, the second grounding switch 152 (S2) can switchably couple the node between C2 and L2 to ground. When S2 is opened, B4 in-band portion of an input signal passes to the B4 filter; and when S2 is closed, all of the input signal, including the B4 in-band portion, is grounded. Further, B2 out-of-band portion of the input signal is grounded regardless of the state of S2 as described herein.

Configured in the foregoing example manner, a CA mode can be effectuated by opening both of the switches S1 and S2. In such a mode, the out-of-band portion is grounded while the in-band portion is routed to its respective filter.

Figure 16:
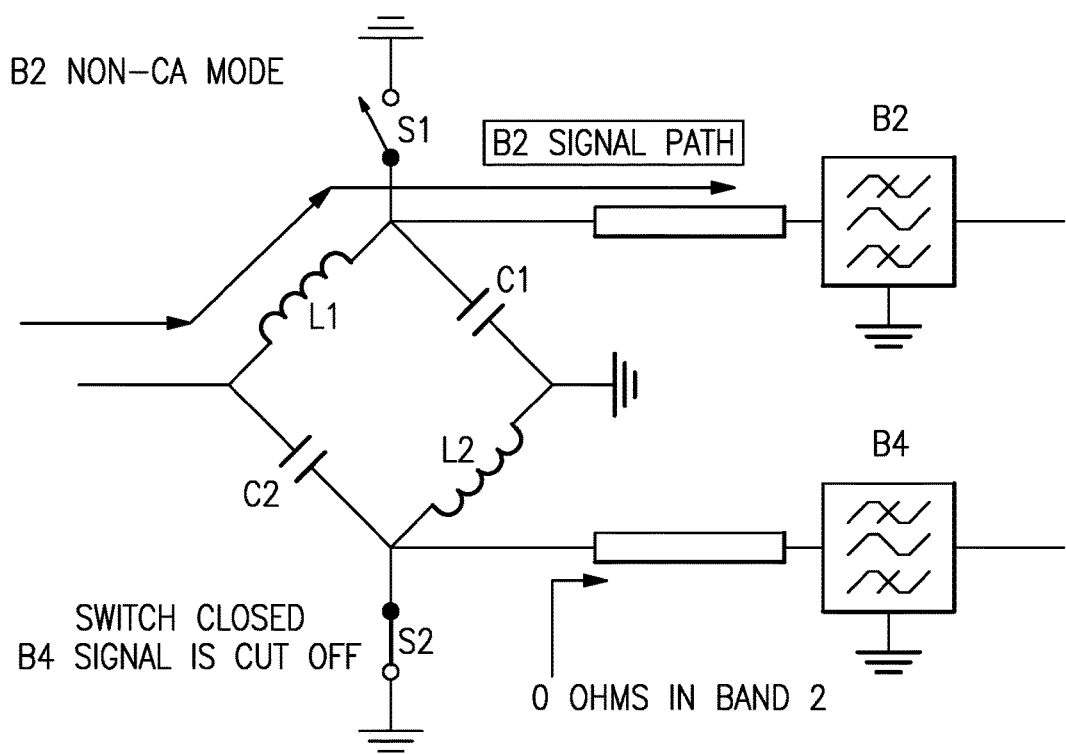
FIG. 16 shows an example of a non-CA mode facilitated by the grounding switches of FIG. 15.

FIG. 16 shows an example of a non-CA mode where the first switch S1 is in an open state and the second switch S2 is in a closed state. Such a configuration allows a B2 non-CA mode to be implemented. More particularly, the desired B2 in-band portion of the input signal is allowed to be routed to the B2 band filter as shown due to S1 being open, and the undesired B4 out-of-band portion of the input signal is grounded along the route to the B2 filter even with S1 being open. For the B4 filter, its in-band portion of the input signal is grounded due to S2 being closed; and its out-of-band portion of the input signal is grounded regardless of the state of S2.

Similarly, a B4 non-CA mode can be implemented by closing S1 and opening S2. In such a mode, the desired B4 in-band portion of the input signal is allowed to be routed to the B4 band filter due to S2 being open, and the undesired B2 out-of-band portion of the input signal is grounded along the route to the B4 filter even with S2 being open. For the B2 filter, its in-band portion of the input signal is grounded due to S1 being closed; and its out-of-band portion of the input signal is grounded regardless of the state of S1.

Figure 17:
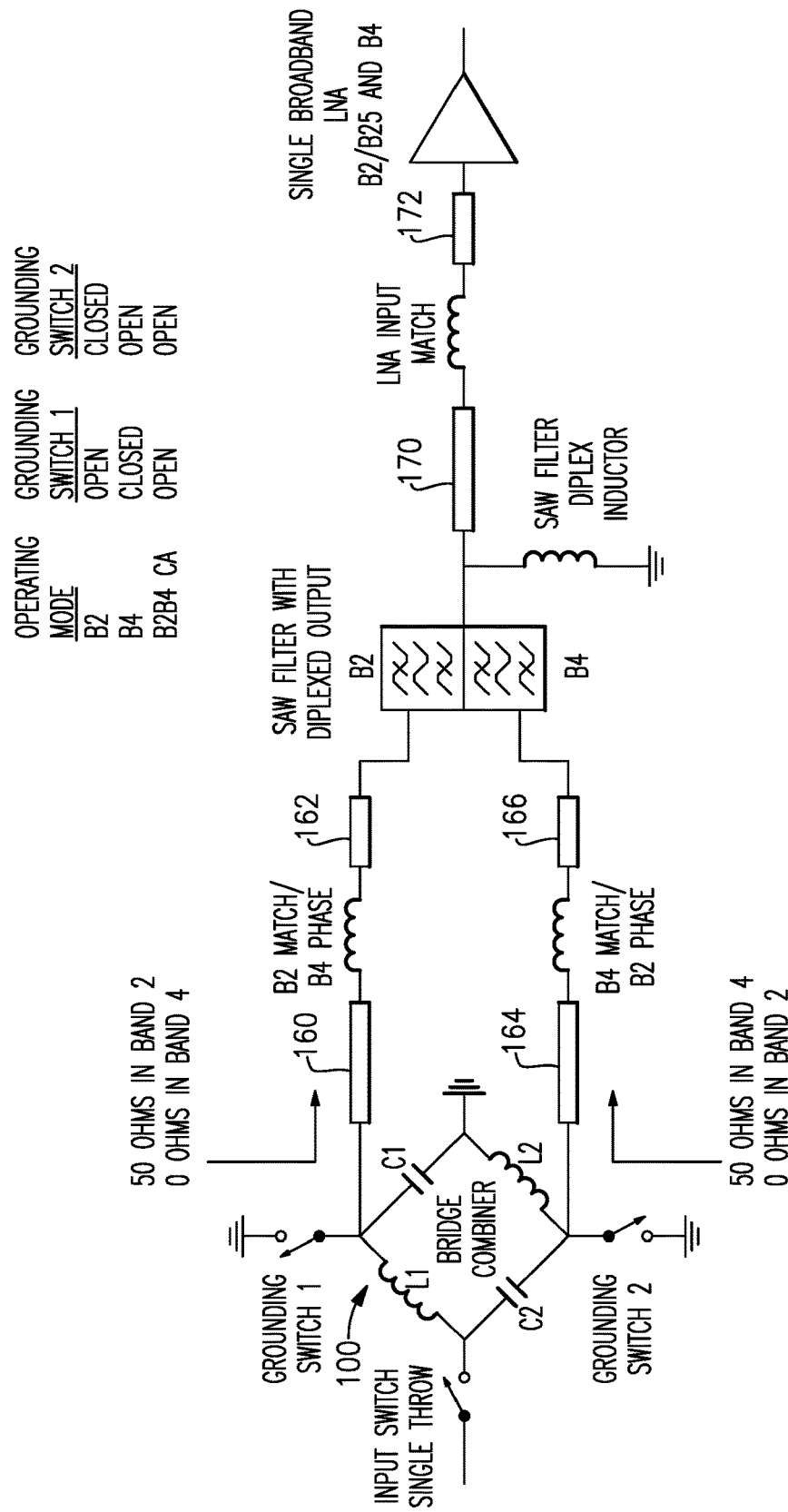
FIG. 17 shows an example architecture where a CA circuit having one or more features as described herein can be utilized with a low-noise amplifier (LNA).

FIG. 17 shows an example of a low-noise amplifier (LNA) system having a CA circuit 100 as described herein in reference to FIGS. 3 and 15. In the example shown in FIG. 17, an input switch is shown to be provided along the input path to the node between L1 and C2. Such an input switch can be used to activate or deactivate the entire RF path of the LNA system.

As described herein, the node between L1 and C1 can be coupled to a B2 filter. Such a signal path can include a transmission line 160, a circuit configured to provide B2 matching and/or B4 phase shifting, and a transmission line 162. As also described herein, the node between C2 and L2 can be coupled to a B4 filter. Such a signal path can include a transmission line 164, a circuit configured to provide B4 matching and/or B2 phase shifting, and a transmission line 166.

As also described herein, the grounding switches can be provided to allow switchable grounding of the node between L1 and C1 and switchable grounding of the node between C2 and L2.

In the example of FIG. 17, The B2 and B4 filters (e.g., SAW filters) are shown to be configured to provide a diplexed output. Such a diplexed output is shown to be coupled to an LNA (e.g., a broadband LNA configured to include B2 and B4 operation) through a transmission line 170, a circuit configured to provide input matching for the LNA, and a transmission line 172. The diplexed output of the B2/B4 filter assembly is also shown to be coupled to ground through a shunt inductance.

It is noted that in some embodiments, the CA circuit 100 of FIG. 3 and FIGS. 15-17 can yield an equivalent pi-filter topology for a given band when that band is active and configured in either mode, including CA mode or non-CA mode. For example, and as shown in FIG. 16, band B2 is active due to the switch S1 being open, and the B2 path constitutes a pi-topology with L1, C1 and C2, regardless of the state of the switch S2. Likewise, band B4 is active when the switch S2 is open, and the B4 path constitutes a pi-filter topology with C2, L2, and C1.

In some embodiments, the grounding switches can be configured to provide low resistance to, for example, faciliate efficient grounding of signals in an inactive path in non-CA modes. In some embodiments, lines for connecting the grounding switches can be tuned. Similarly, various signal lines associated with the CA circuit and/or the filters can also be tuned.

Figure 18:
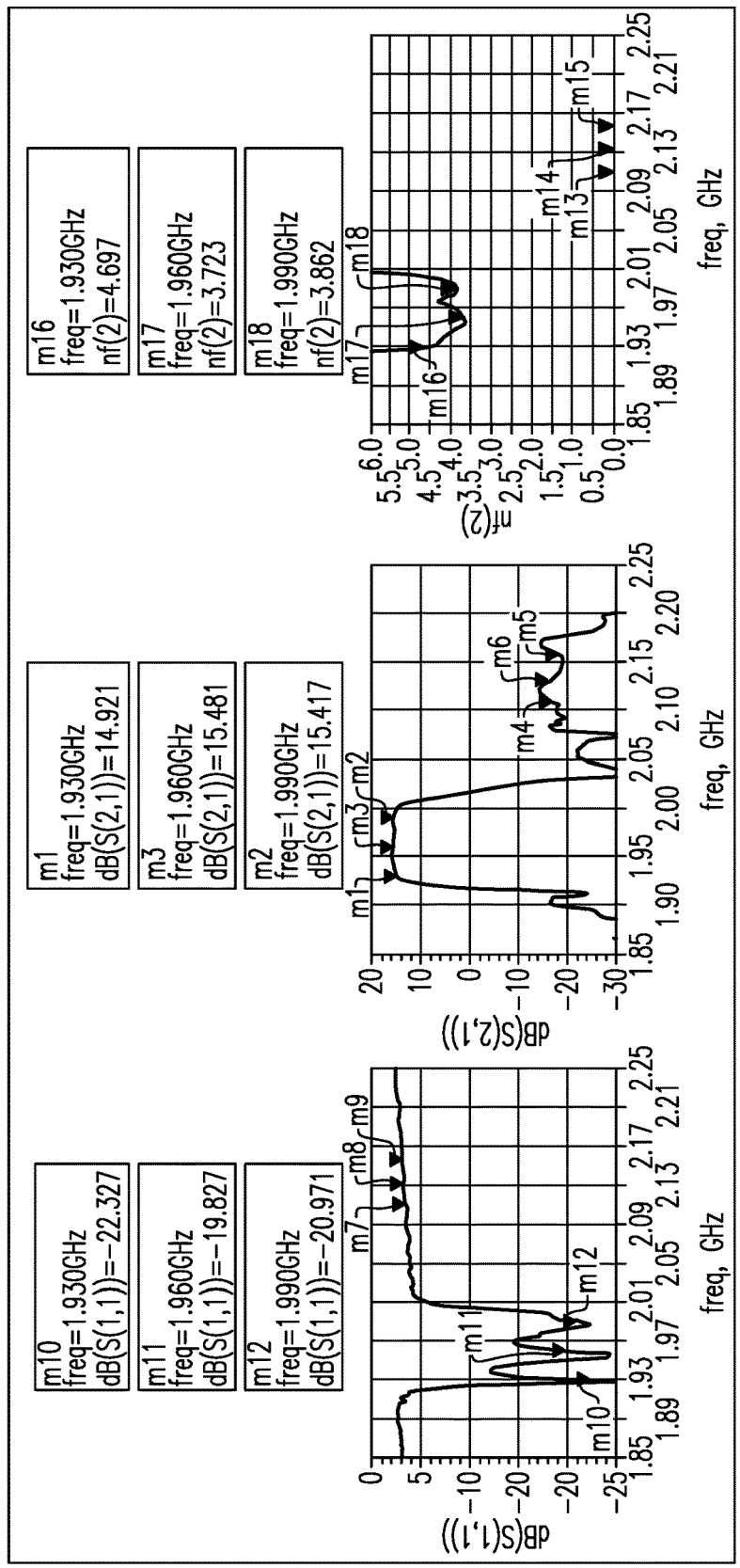
FIG. 18 shows simulated performance plots for the example architecture of FIG. 17 for a B2 non-CA mode.
Figure 19:
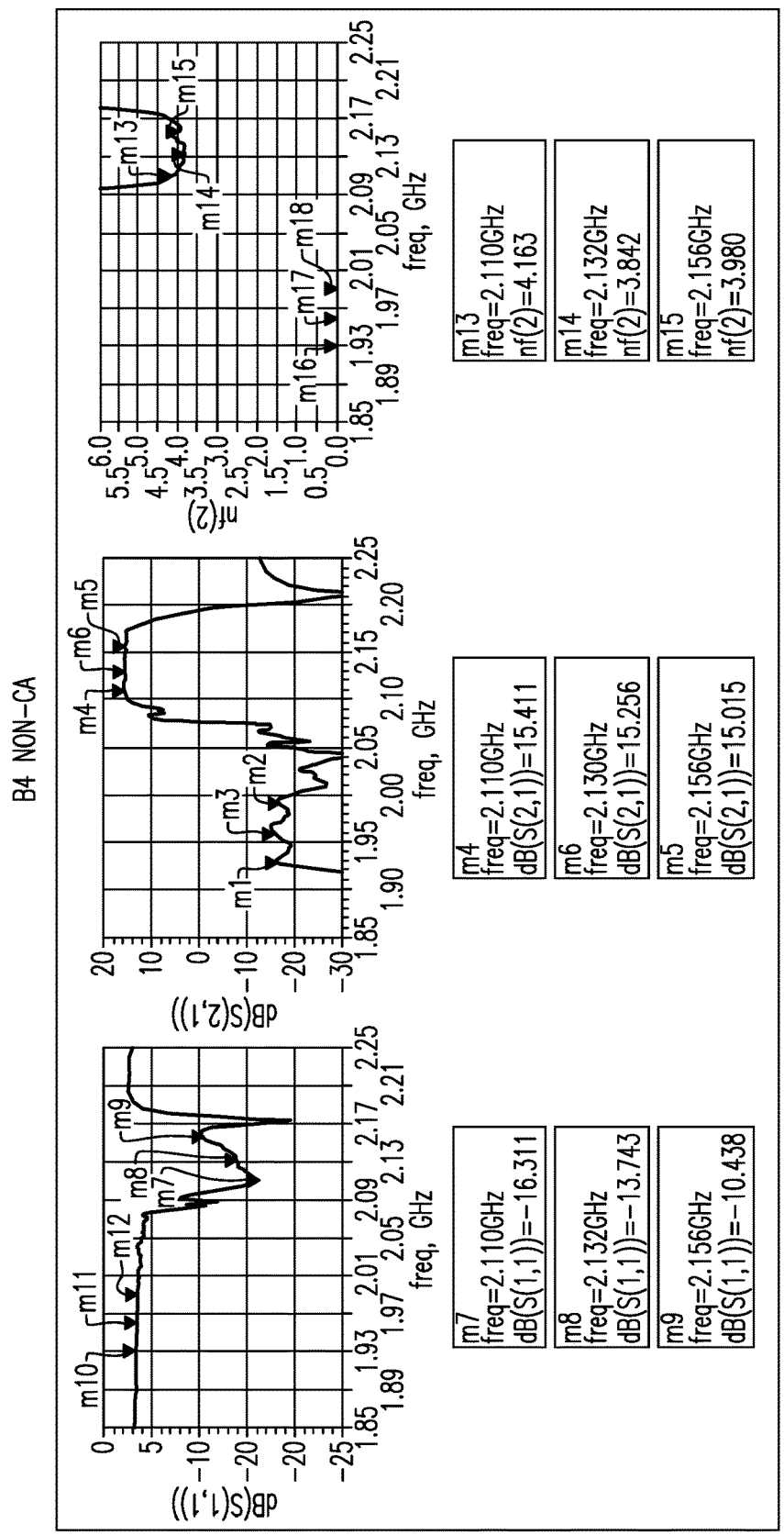
FIG. 19 shows simulated performance plots for the example architecture of FIG. 17 for a B4 non-CA mode.
Figure 20:
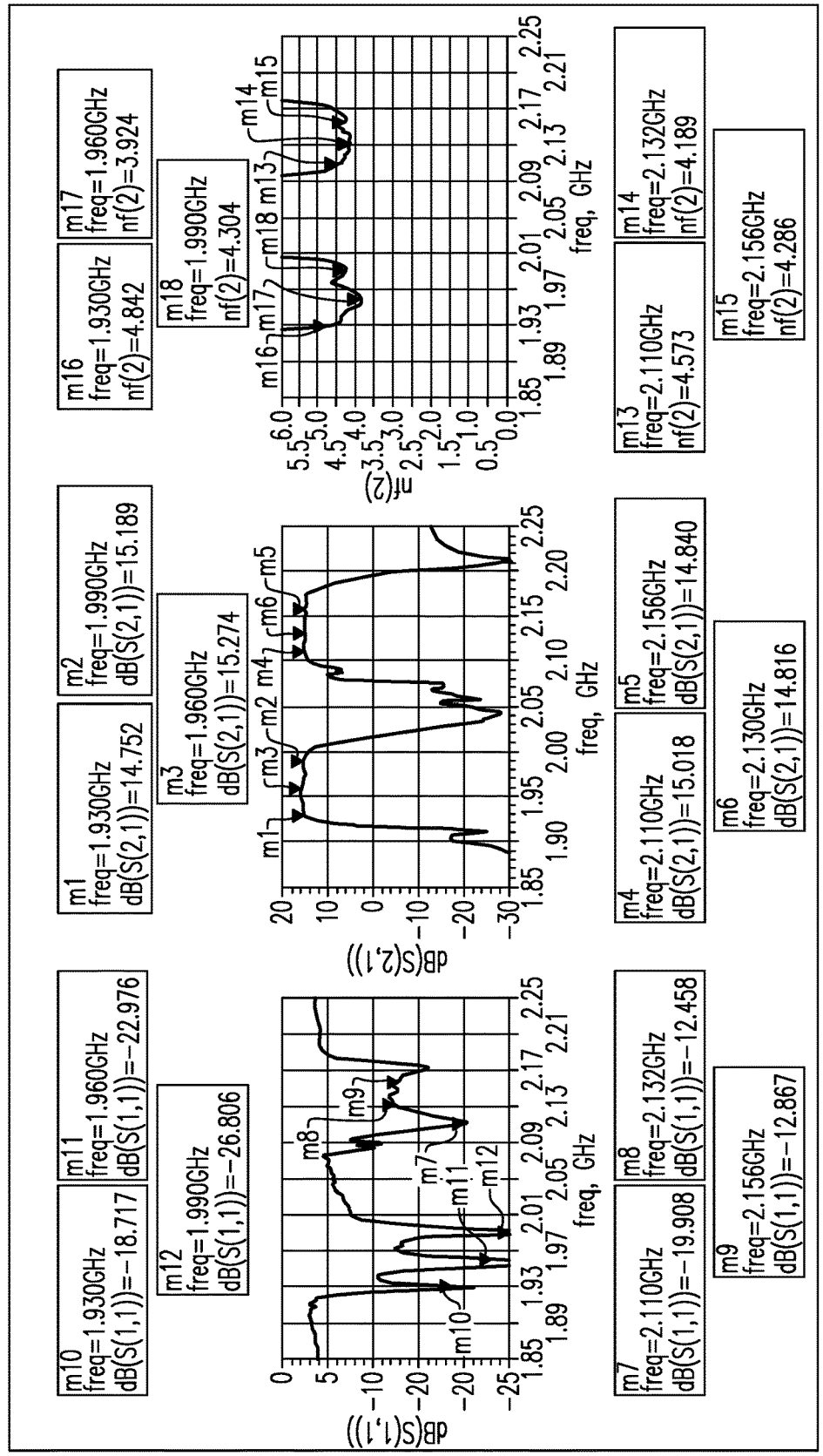
FIG. 20 shows simulated performance plots for the example architecture of FIG. 17 for a CA mode where both B2 and B4 bands are operating.

FIGS. 18-20 show examples of simulated performance plots for the example LNA system of FIG. 17. FIG. 18 is for a B2 non-CA mode, FIG. 19 is for a B4 non-CA mode, and FIG. 20 is for a CA mode where both B2 and B4 bands are operating. In each of FIGS. 18-20, the left panel is a plot of S11 parameter (return loss) as a function of frequency, the middle panel is a plot of S21 parameter (gain) as a function of frequency, and the right panel is a plot of noise figure (NF) as a function of frequency.

Table 1 summarizes mid-band gain, mid-band noise figure, and worst return loss parameters for the different modes of operation.

TABLE 1

| Mode | Mid-band gain S21 | Mid-band NF | Worst return loss S11 |
|---|---|---|---|
| B2 non-CA | 15.481 dB | 3.723 | −12 dB |
| B4 non-CA | 15.256 dB | 3.842 | −10 dB |
| B2 in CA | 15.274 dB | 3.924 | −11 dB |
| B4 in CA | 14.816 dB | 4.189 | −12 dB |

From the example results in Table 1, one can see that performance parameters of B2 and B4 bands in the CA mode compare favorably with those of corresponding non-CA modes. For example, the B2 CA mid-band gain is only 0.207 dB lower than the B2 non-CA mid-band gain, and the B4 CA mid-band gain is only 0.440 dB lower than the B4 non-CA mid-band gain. For the noise figure performance, the B2 CA mid-band NF is only 0.201 higher than the B2 non-CA mid-band NF, and the B4 CA mid-band NF is only 0.347 higher than the B4 non-CA mid-band NF. The worst return losses for the CA mode also compare well with those of the non-CA modes.

Figure 21:
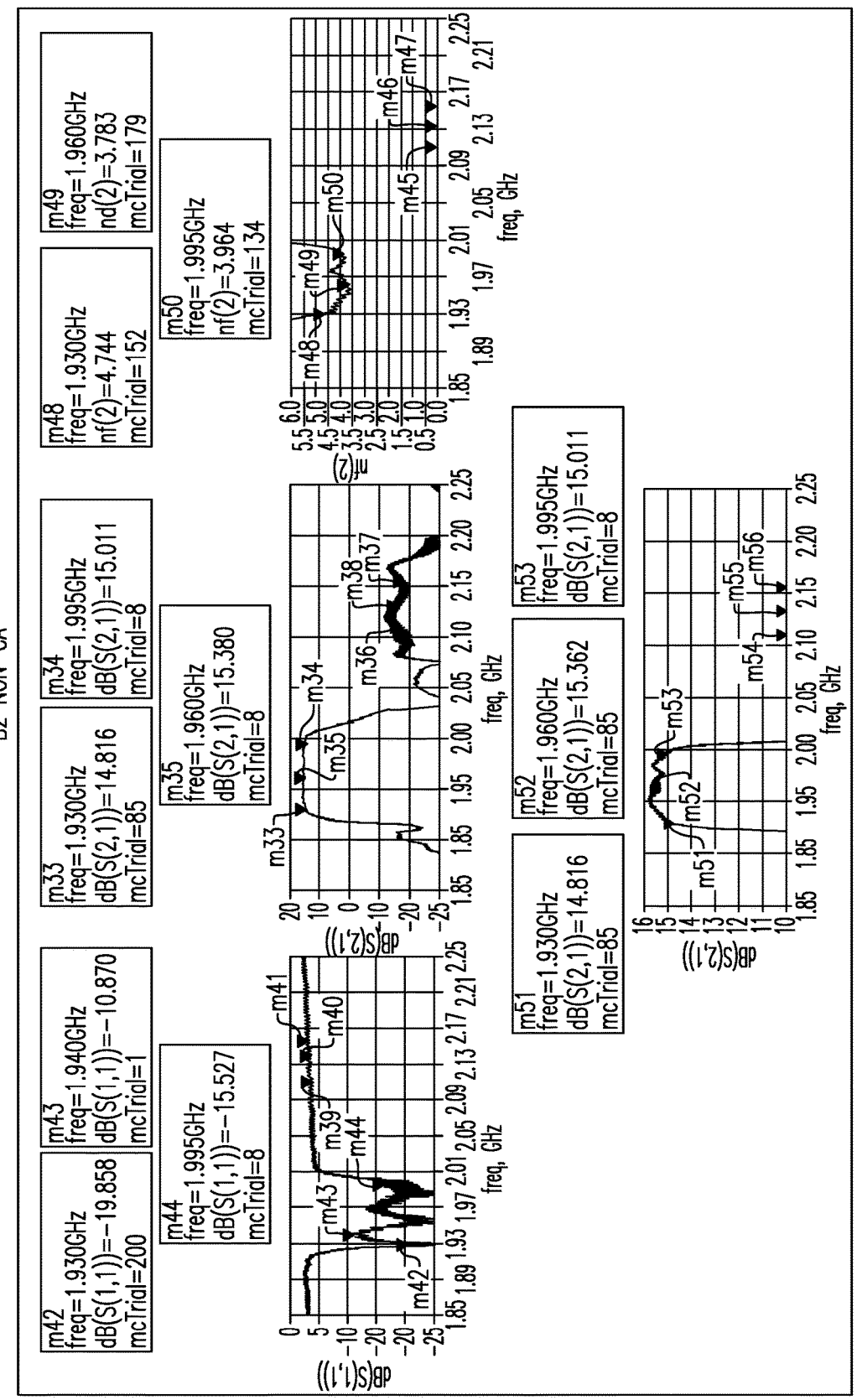
FIG. 21 shows additional simulated performance plots for the example architecture of FIG. 17 for a B2 non-CA mode.
Figure 22:
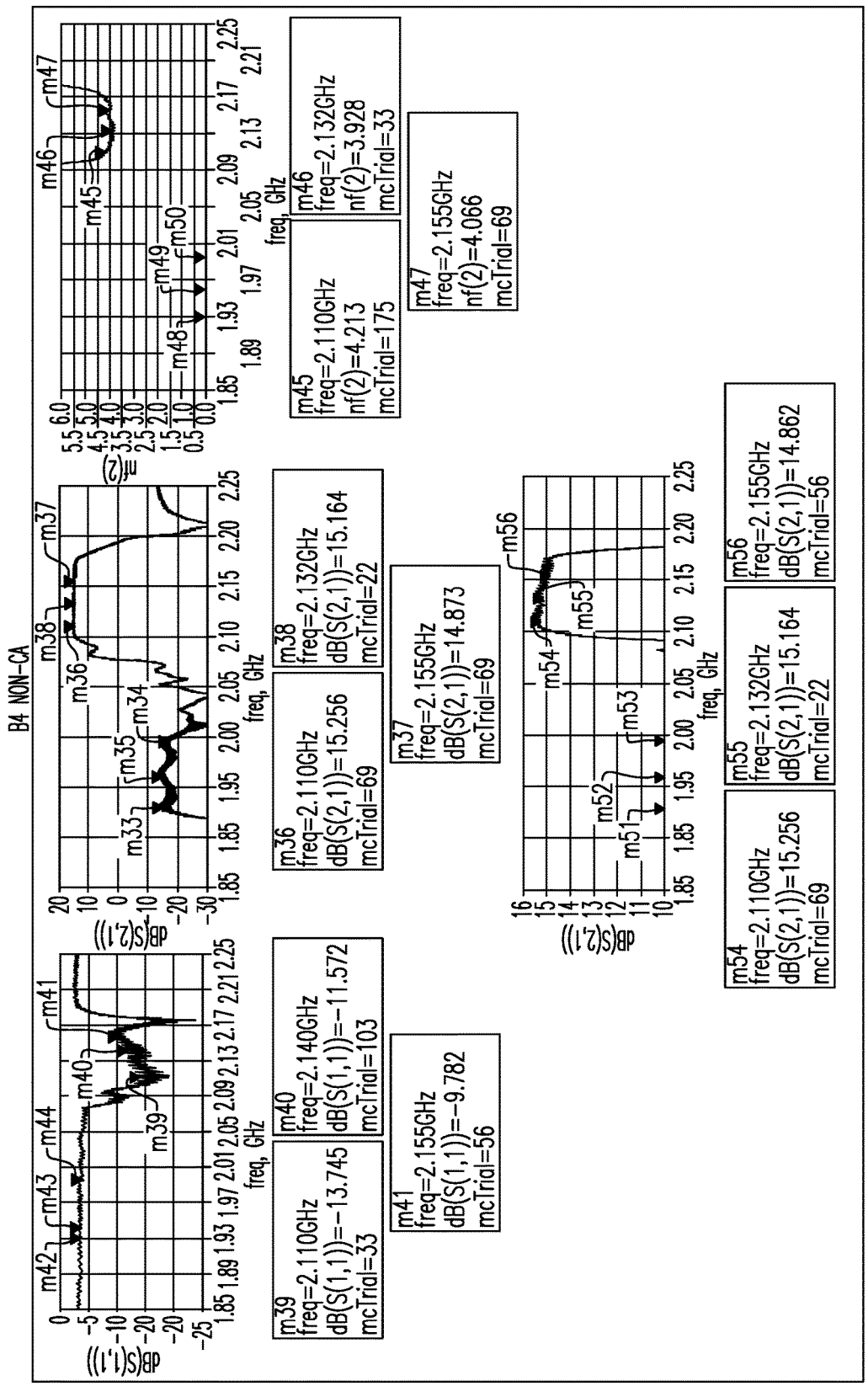
FIG. 22 shows additional simulated performance plots for the example architecture of FIG. 17 for a B4 non-CA mode.
Figure 23:
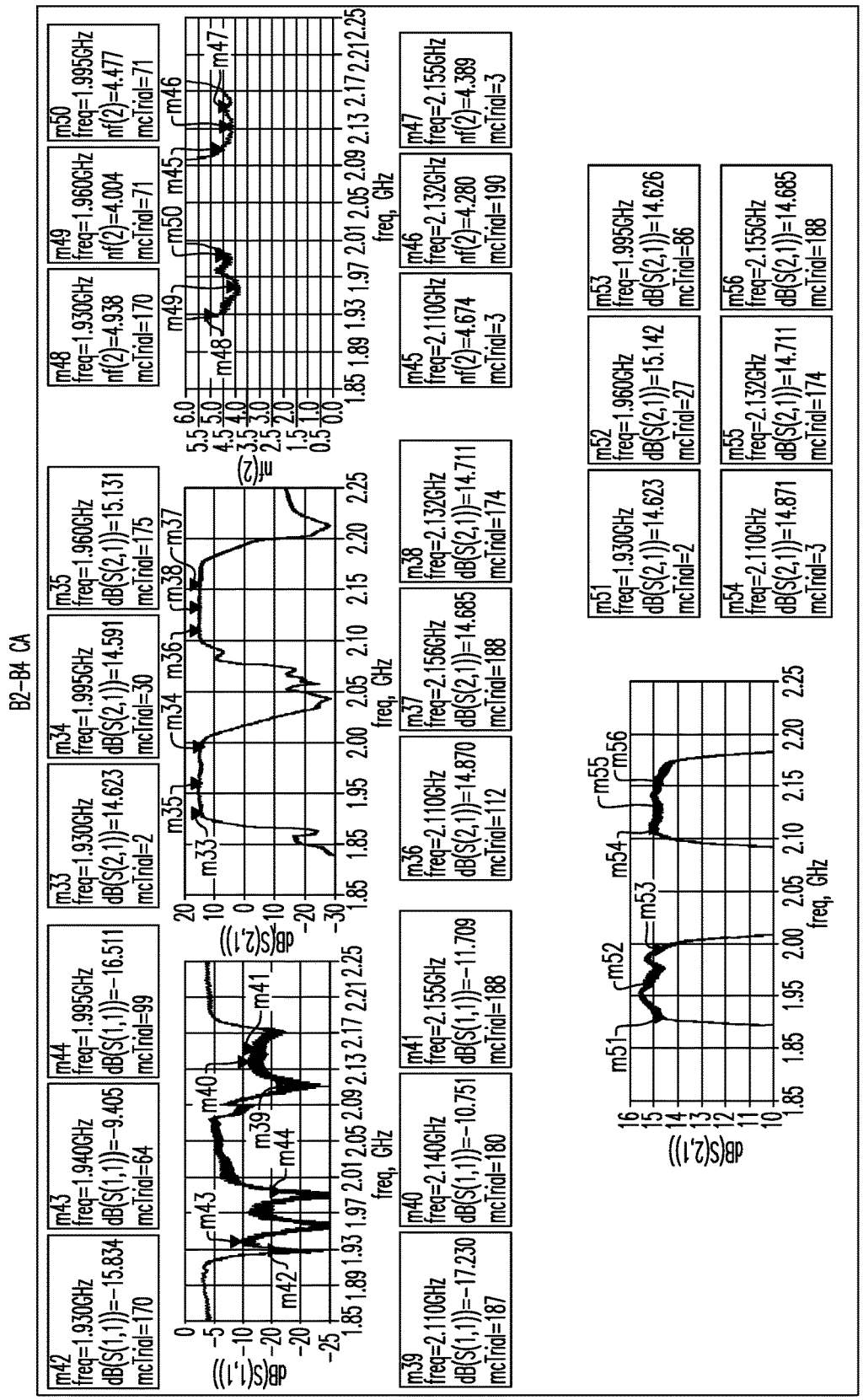
FIG. 23 shows additional simulated performance plots for the example architecture of FIG. 17 for a CA mode where both B2 and B4 bands are operating.

FIGS. 21-23 show examples of Monte Carlo results where 200 runs (each similar to the simulations of FIGS. 18-20) were performed with +/−5% uniform distribution on all components for the example LNA system of FIG. 17. FIG. 21 is for the B2 non-CA mode, FIG. 22 is for the B4 non-CA mode, and FIG. 23 is for the CA mode where both B2 and B4 bands are operating.

Table 2 summarizes mid-band gain, mid-band noise figure, and peak S11 (return loss) performance parameters for the different modes of operation.

TABLE 2

| Mode | Mid-band gain S21 | Mid-band NF | Peak return loss S11 |
|---|---|---|---|
| B2 non-CA | At 1960 MHz<br>Nom = 15.481 dB<br>Worst = 15.362 dB | At 1960 MHz<br>Nom = 3.723<br>Worst = 3.783 | At highest point<br>Nom = −12.1 dB<br>Worst = −10.8 dB |
| B4 non-CA | At 2132 MHz<br>Nom = 15.291 dB<br>Worst = 15.164 dB | At 2132 MHz<br>Nom = 3.841<br>Worst = 3.928 | At highest point<br>Nom = −10.1 dB<br>Worst = −9.8 dB |
| B2 in CA | At 1960 MHz<br>Nom = 15.274 dB<br>Worst = 15.131 dB | At 1960 MHz<br>Nom = 3.924<br>Worst = 4.004 | At highest point<br>Nom = −10.6 dB<br>Worst = −9.4 dB |
| B4 in CA | At 2132 MHz<br>Nom = 14.868 dB<br>Worst = 14.711 dB | At 2132 MHz<br>Nom = 4.189<br>Worst = 4.280 | At highest point<br>Nom = −12.0 dB<br>Worst = −10.7 dB |

Again, one can see that performance of B2 and B4 bands in the CA mode compare favorably with performance values of B2 and B4 bands in non-CA modes.

Figure 24:
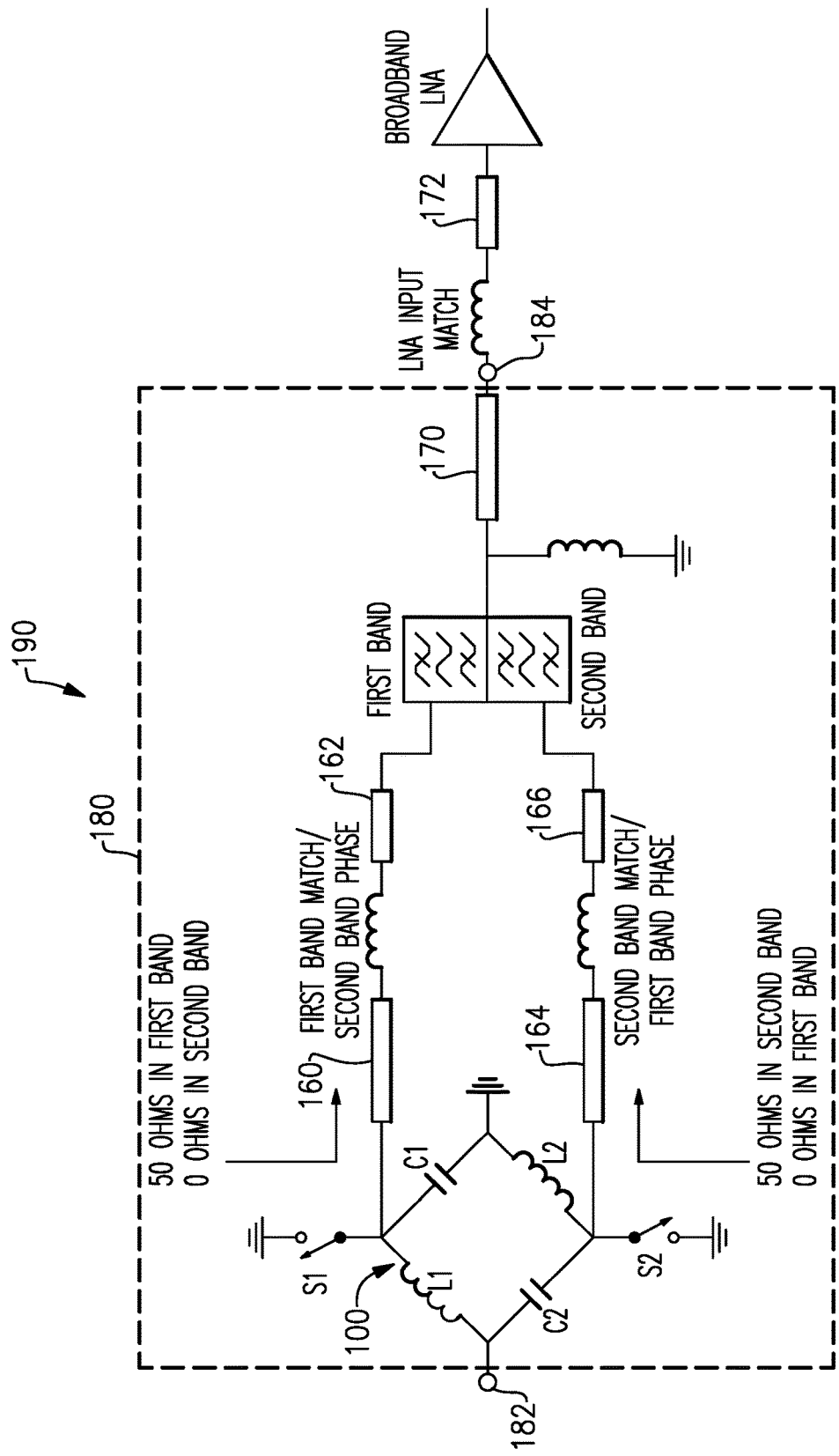
FIG. 24 shows an architecture that is similar to the example of FIG. 17, but generalized in terms of first and second bands.
Figure 25:
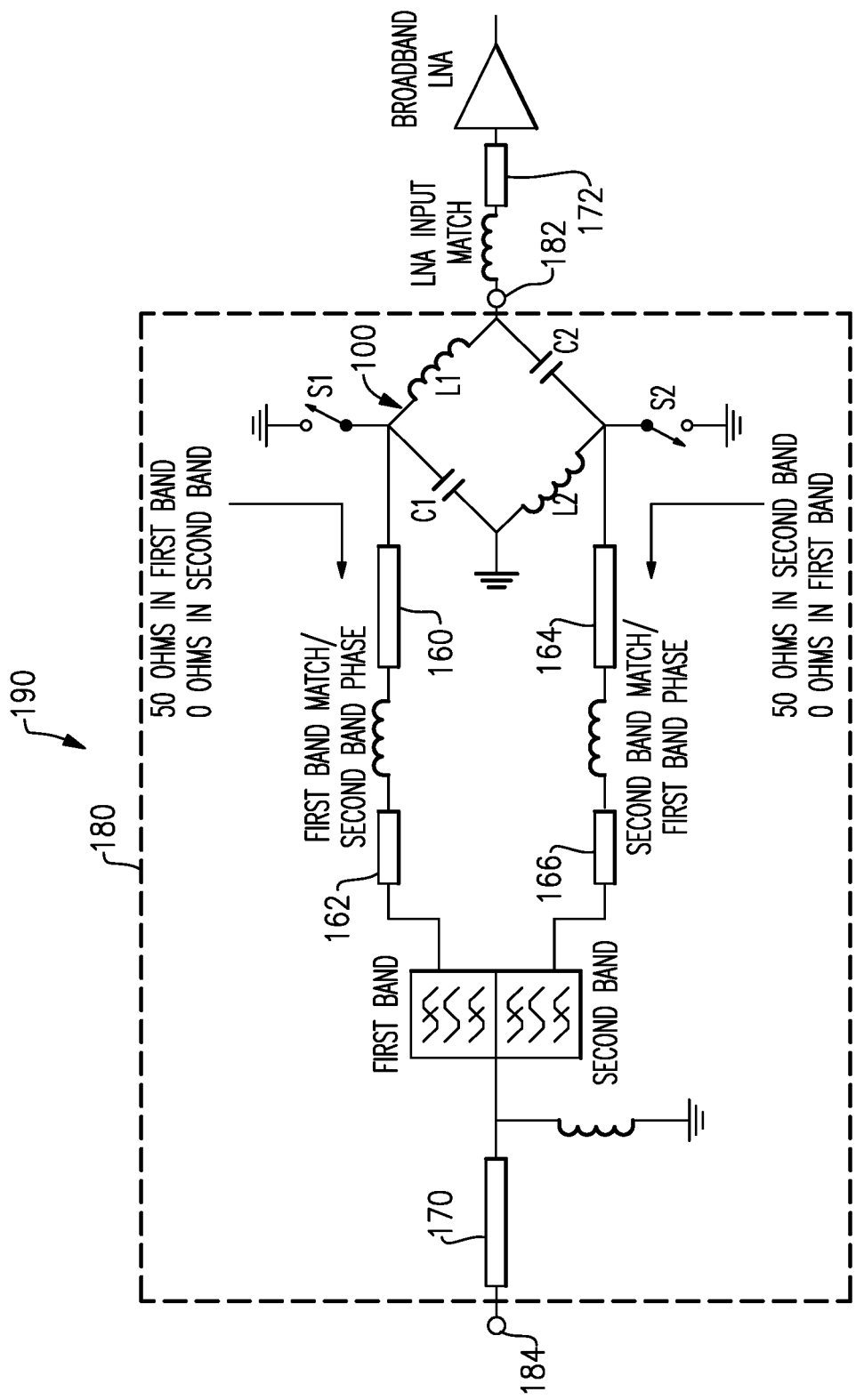
FIG. 25 shows that some or all of a portion of the architecture in the example of FIG. 24 can be configured and operated in reverse.

FIGS. 24-29 show examples that can include variations and/or be based on one or more features as described herein. FIG. 24 shows an architecture 190 that is similar to the example described herein in reference to FIG. 17, but generalized in terms of first and second bands instead of the more specific example bands B2 and B4. Further, FIGS. 24 and 25 show that in some embodiments, a CA circuit 100 as described herein can be operated in forward and reverse configurations.

For example, suppose that the configurations of FIG. 24 is considered to be a forward configuration. In such a configuration, an input RF signal can be received at a common input node 182 and be processed through the CA circuit 100 so as to have the first and second band signals emerge from their respective filters and be presented to an LNA (e.g., a broadband LNA) through a common output node 184. For the purpose of description, a portion of the example architecture 190 between the common input and common output nodes 182, 184 is depicted as 180.

FIG. 25 shows that some or all of the portion 180 in the example of FIG. 24 can be configured and operated in reverse. For example, an architecture 190 can include a CA circuit 100 downstream of filters for the first and second bands. Thus, an RF signal can be received at a common input node 184 and be routed through a transmission line 170 to a common input of diplexed filters for the first and second bands.

In the example of FIG. 25, and as described in reference to FIG. 17, a node between L1 and C1 of the CA circuit 100 can be coupled to the filter for the first band. Such a signal path can include a transmission line 162, a circuit configured to provide first band matching and/or second band phase shifting, and a transmission line 160. Similarly, a node between C2 and L2 of the CA circuit 100 can be coupled to the filter for the second band. Such a signal path can include a transmission line 166, a circuit configured to provide second band matching and/or first band phase shifting, and a transmission line 164.

As also described herein in reference to FIG. 17, the grounding switches can be provided in the example of FIG. 25, to allow switchable grounding of the node between L1 and C1 and switchable grounding of the node between C2 and L2.

In the example of FIG. 25, a node between C1 and L2 of the CA circuit 100 is shown to be grounded, and a node between L1 and C2 can function as a common output node 182. Such a common output node 182 can be coupled to an input of an LNA (e.g., a broadband LNA) through an LNA input matching circuit and a transmission line 172.

In the example of FIG. 25, and similar to the example of FIG. 17, the node between C1 and L1 of the CA circuit 100 is shown to present a matched impedance (e.g., 50 Ohms) at the first band, and approximately 0 Ohm impedance at the second band. Similarly, the node between C2 and L2 of the CA circuit 100 is shown to present a matched impedance (e.g., 50 Ohms) at the second band, and approximately 0 Ohm impedance at the first band. Accordingly, the architecture 190 can provide effective CA and non-CA functionalities by various states of the switches S1 and S2, as described in reference to FIG. 17.

Figure 26A:
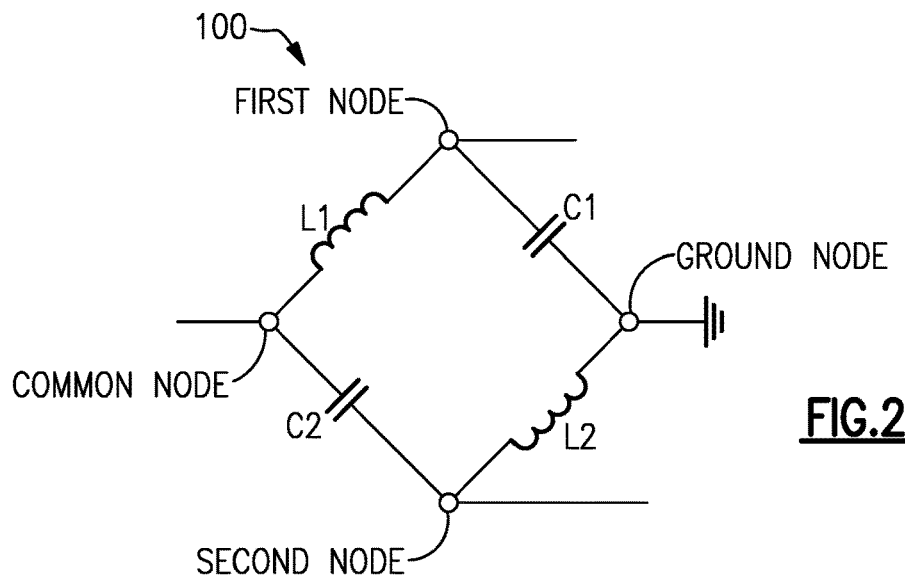
FIG. 26A shows a CA circuit having one or more features as described herein.
Figure 26B:
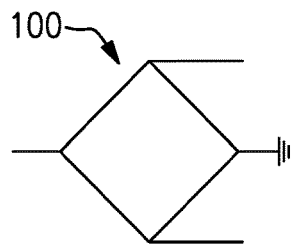
FIG. 26B shows a simplified depiction of the CA circuit of FIG. 26A.
Figure 27:
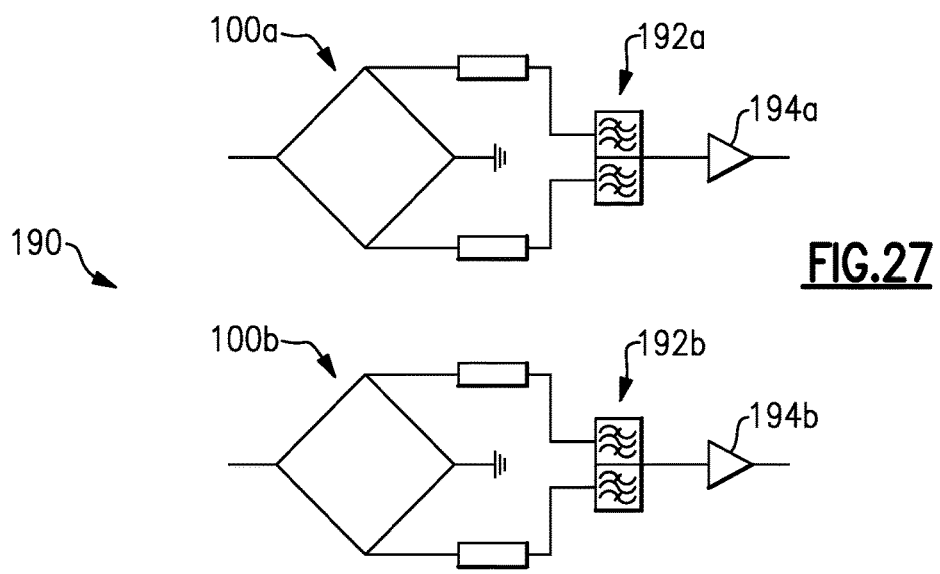
FIG. 27 shows that in some embodiments, a CA architecture can include a plurality of CA paths, with each CA path including a CA circuit having one or more features as described herein.
Figure 28:
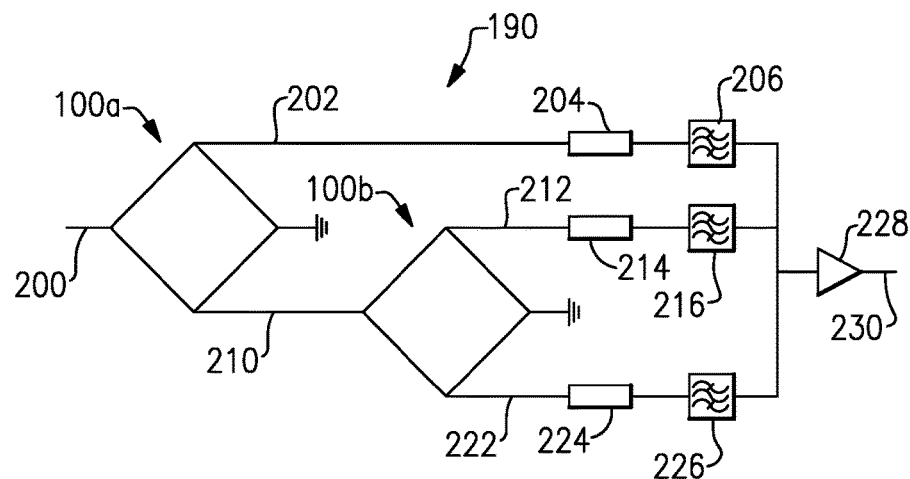
FIG. 28 shows an example CA architecture that can include a plurality of CA circuits to support aggregation of multiple bands.
Figure 29:
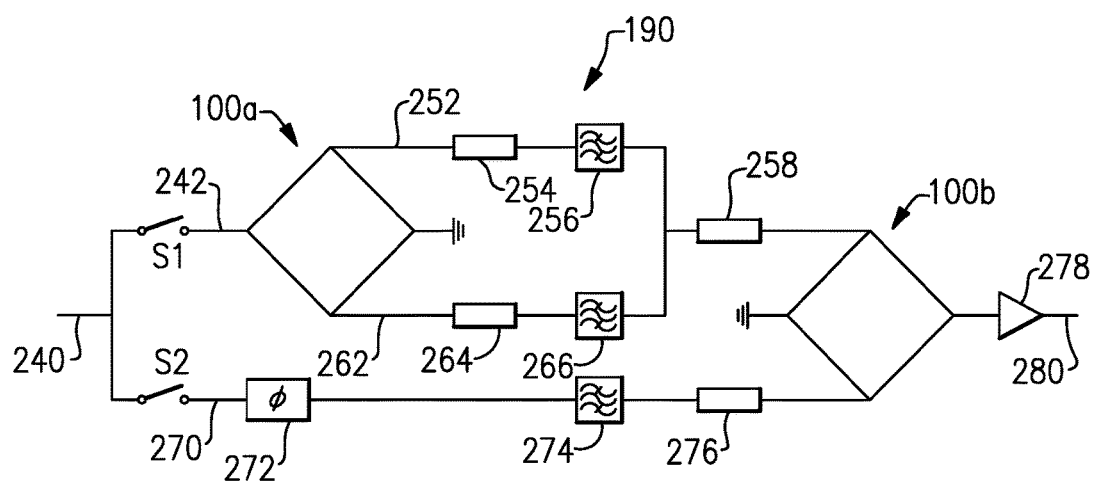
FIG. 29 shows another example CA architecture that can include a plurality of CA circuits to support aggregation of multiple bands.

FIGS. 27-29 show additional examples in which one or more CA circuits as described herein can be implemented. Such examples are shown with a CA circuit 100 depicted as a diamond-shaped circuit. For the purpose of description, it will be understood that such a diamond-shaped circuit, as also shown in FIG. 26B, can represent a CA circuit 100 shown in FIG. 26A and in other Figures herein. More particularly, a diamond-shaped circuit is shown to include a common node and a ground node on opposing corners. A first node is shown to be between L1 and C1, and a second node is shown to be between C2 and L2. It will be understood that such a circuit is described as a diamond-shaped circuit for convenience; and that a circuit having similar functionality can be depicted and/or implemented in other shapes.

FIG. 27 shows that in some embodiments, a CA architecture can include a plurality of CA paths, with each CA path including a CA circuit 100 having one or more features as described herein. For example, a first CA path can be configured to support CA operation of first and second bands utilizing a first CA circuit 100a. Such a CA circuit can be coupled to corresponding diplexed filters 192a for the first and second bands, and an aggregated signal resulting from such a CA path can be provided to a first LNA 194a. Similarly, a second CA path can be configured to support CA operation of third and fourth bands utilizing a second CA circuit 100b. Such a CA circuit can be coupled to corresponding diplexed filters 192b for the third and fourth bands, and an aggregated signal resulting from such a CA path can be provided to a second LNA 194b. Examples of frequency bands that can be supported by the foregoing CA architecture are described herein in greater detail.

FIGS. 28 and 29 show non-limiting examples of how first and second CA circuits can be coupled with each other to support aggregation of multiple bands. FIG. 28 shows an example CA architecture 190 in which two CA circuits 100a, 100b can be coupled with each other to provide CA functionality for three bands. In the example CA architecture 190 of FIG. 28, the first CA circuit 100a is shown to be implemented in a forward direction (e.g., as described in reference to FIG. 24), such that a common input path 200 receives an RF signal. The first node of the first CA circuit 100a is shown to be coupled to a first filter 206 through path 202 that can include a transmission line 204. The second node of the first CA circuit 100a is shown to be coupled (through path 210) to a common input node of a second CA circuit 100b, also implemented in a forward direction.

In the example of FIG. 28, the first node of the second CA circuit 100b is shown to be coupled to a second filter 216 through path 212 that can include a transmission line 214. The second node of the second CA circuit 100b is shown to be coupled to a third filter 226 through path 222 that can include a transmission line 224. Outputs of the first, second and third filters 206, 216, 226 are shown to be combined into a common output path provided as an input to an LNA 228. Such an LNA is shown to include an output 230.

In the example of FIG. 28, bands associated with the first, second and third filters 206, 216, 226 can be, for example, B7, B1 and B3, respectively. Accordingly, the second node of the first CA circuit 100a (and thus the common input node of the second CA circuit 100b) can provide matched impedance for the B1 and B3 bands while providing 0 Ohm impedance for the B7 band. The second CA circuit 100b can then process the B1 and B3 bands as described herein. It will be understood that other combinations of bands an also be processed by the example configuration of FIG. 28.

FIG. 29 shows another example CA architecture 190 in which two CA circuits 100a, 100b can be coupled with each other to provide CA functionality for three bands. In the example CA architecture 190 of FIG. 29, the first CA circuit 100a is shown to be implemented in a forward direction (e.g., as described in reference to FIG. 24), such that its input path 242 receives an RF signal. The first node of the first CA circuit 100a is shown to be coupled to a first filter 256 through path 252 that can include a transmission line 254. The second node of the first CA circuit 100a is shown to be coupled to a second filter 266 through path 262 that can include a transmission line 264.

In the example of FIG. 29, the second CA circuit 100b is shown to be implemented in a reverse direction (e.g., as described in reference to FIG. 25), such that its first and second nodes receive respective signals, and the common output node is coupled to an LNA 278 (which in turn generates an output 280). More particularly, the first node of the second CA circuit 100b is shown to be coupled to a common output of the first and second filters 256, 266, through a transmission line 258. The second node of the second CA circuit 100b is shown to be coupled to a third filter 274 through a transmission line 276. The third filter 274 is shown to be coupled to an input path 270 through, for example, a phase shifter 272.

In the example of FIG. 29, the input path 242 for the first CA circuit 100a and the input path 270 for the third filter 274 are shown to be switchably coupled to a common input 240 through respective switches S1 and S2. Accordingly, the three bands associated with the filters 256, 266, 274 can be supported for three-band CA operation, two-band CA operation, non-CA operations, or any combination thereof.

In the example of FIG. 29, bands associated with the first, second and third filters 256, 266, 274 can be, for example, B1, B3 and B7, respectively. Accordingly, the first node of the second CA circuit 100b can provide matched impedance for the B1 and B3 bands while providing 0 Ohm impedance for the B7 band. It will be understood that other combinations of bands an also be processed by the example configuration of FIG. 29.

Figure 30:
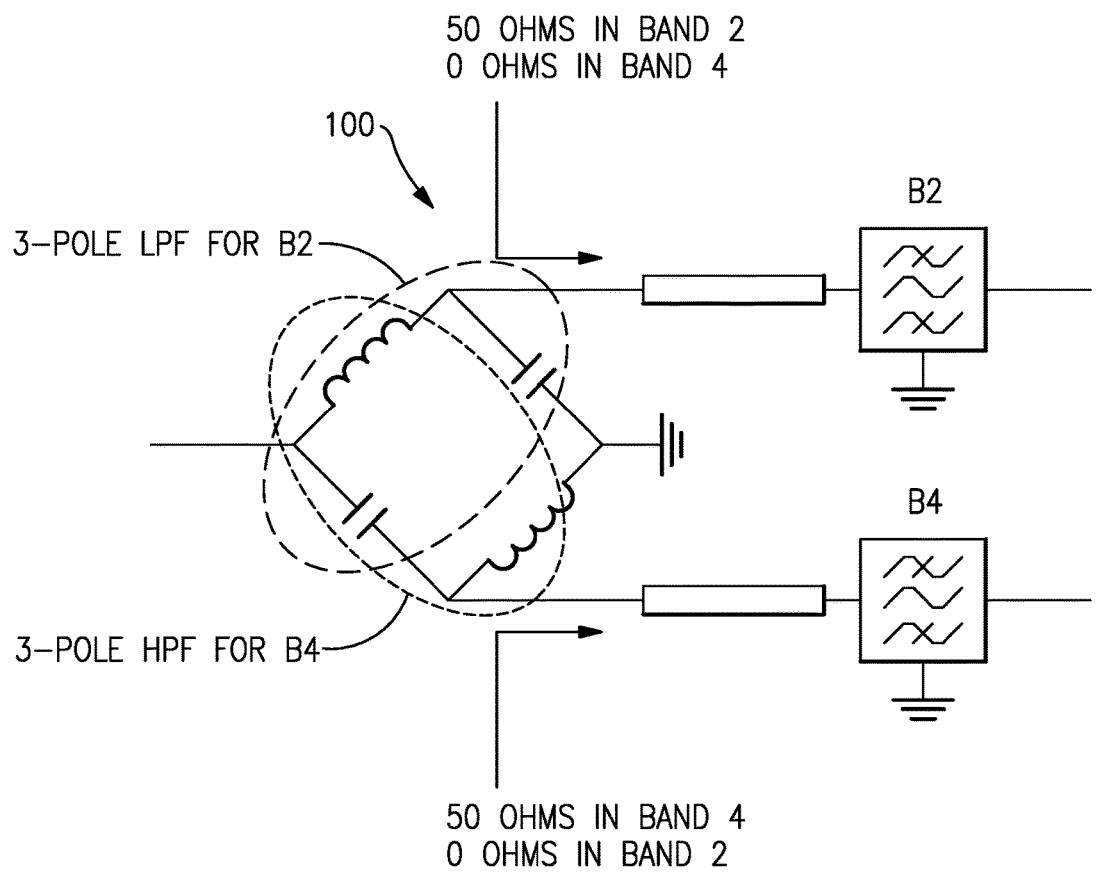
FIG. 30 shows a CA circuit implemented in a CA architecture similar to the example of FIG. 3.

While it is not desired or intended to be bound by any particular theory or model, a CA circuit having one or more features as described herein can be described in terms of a combination of a 3-pole low-pass filter (LPF) and a 3-pole high-pass filter (HPF). FIG. 30 shows a CA circuit 100 implemented in a CA architecture similar to the example of FIG. 3. In FIG. 30, the first and second bands are depicted as being bands B2 and B4 for the purpose of description. However, it will be understood that the first and second bands can include other bands.

Figure 31A:
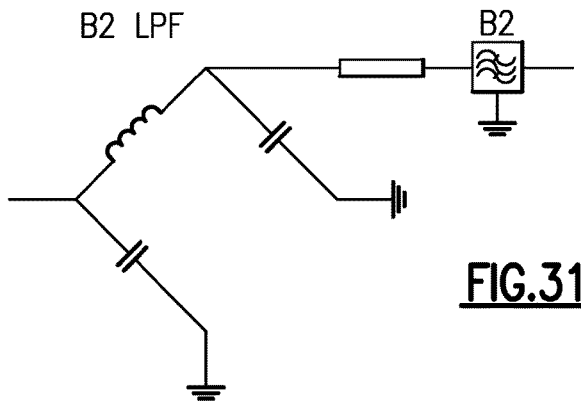
FIG. 31A shows that a portion of the CA circuit of FIG. 30 can be described as a 3-pole low-pass filter (LPF).

In the example of FIG. 30, the indicated portion of the CA circuit 100 can be described as a 3-pole LPF for the B2 band, and the indicated portion of the CA circuit 100 can be described as a 3-pole HPF for the B4 band. FIG. 31A depicts the 3-pole LPF configuration by itself for clarity, and FIG. 32A depicts the 3-pole HPF configuration by itself for clarity.

Figure 31B:
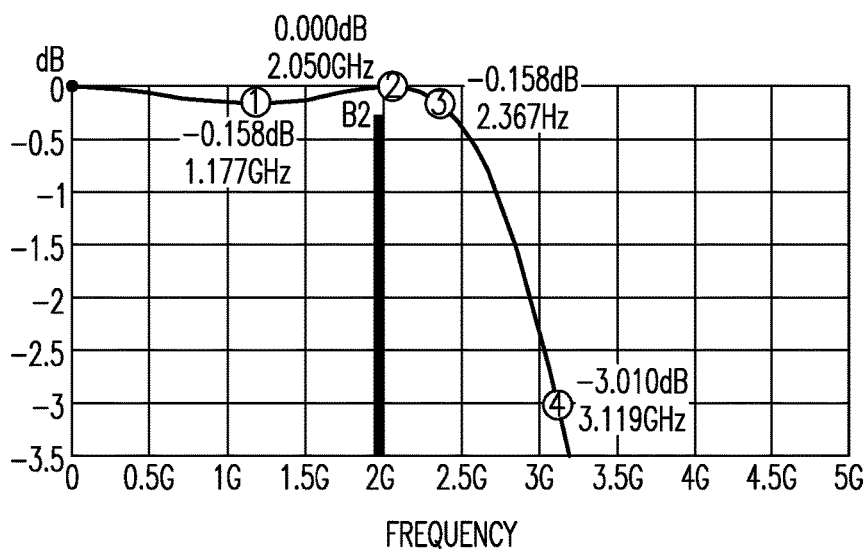
FIG. 31B shows an example response curve for the LPF of FIG. 31A.

Referring to the 3-pole LPF of FIGS. 30 and 31A in the context of the example B2 band, FIG. 31B shows a response curve on the B2 path. The response curve is shown to include a pass response for the B2 band. Referring to the 3-pole HPF of FIGS. 30 and 32A in the context of the example B4 band, FIG. 32B shows a response curve on the B4 path. The response curve is shown to include a pass response for the B4 band. Accordingly, one can note that each of the LPF and HPF provides matching between source impedance (e.g., 50 Ohms) and load impedance (e.g., 50 Ohms).

Figure 31C:
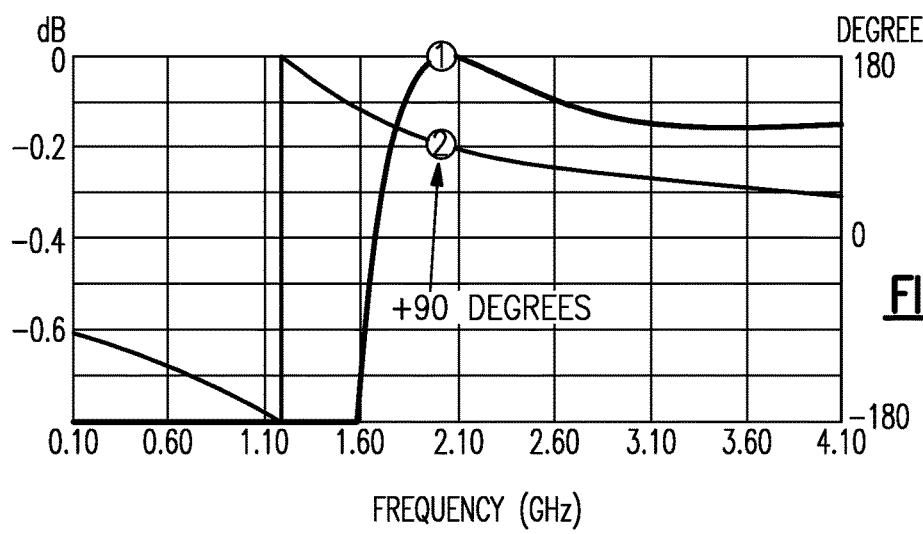
FIG. 31C shows an example phase shift associated with the LPF of FIG. 31A.

In addition to the foregoing impedance matching features of the LPF and HPF, it is noted that each filter can shift phase by, for example, 90 degrees. For example, and referring to the 3-pole LPF of FIGS. 30 and 31A in the context of the example B2 band, FIG. 31C shows the foregoing response curve on the B2 path superimposed with a phase angle plot. One can see that at the B2 band, the phase angle has a value of approximately −90 degrees.

Figure 32A:
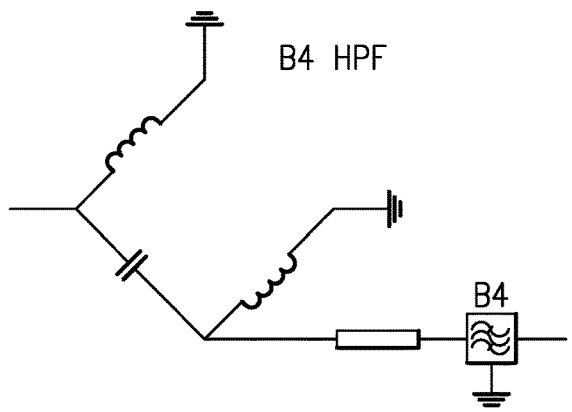
FIG. 32A shows that a portion of the CA circuit of FIG. 30 can be described as a 3-pole high-pass filter (HPF).
Figure 32B:
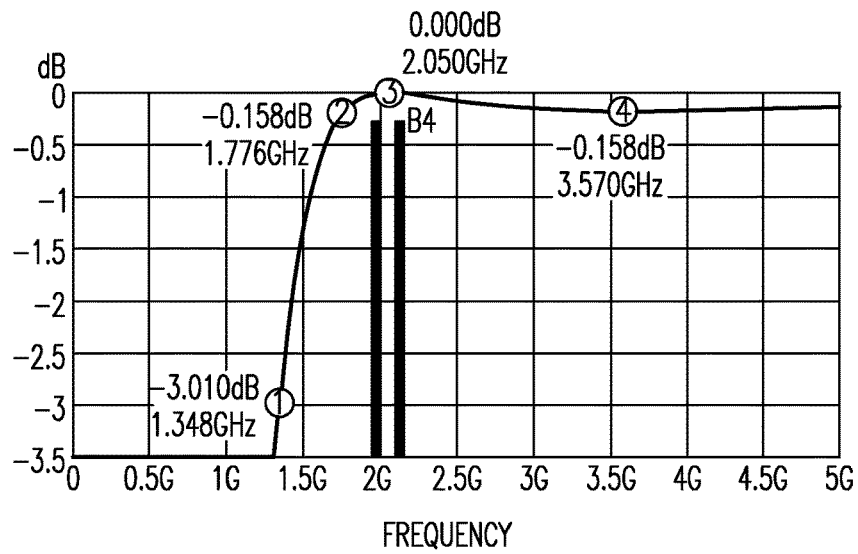
FIG. 32B shows an example response curve for the HPF of FIG. 32A.
Figure 32C:
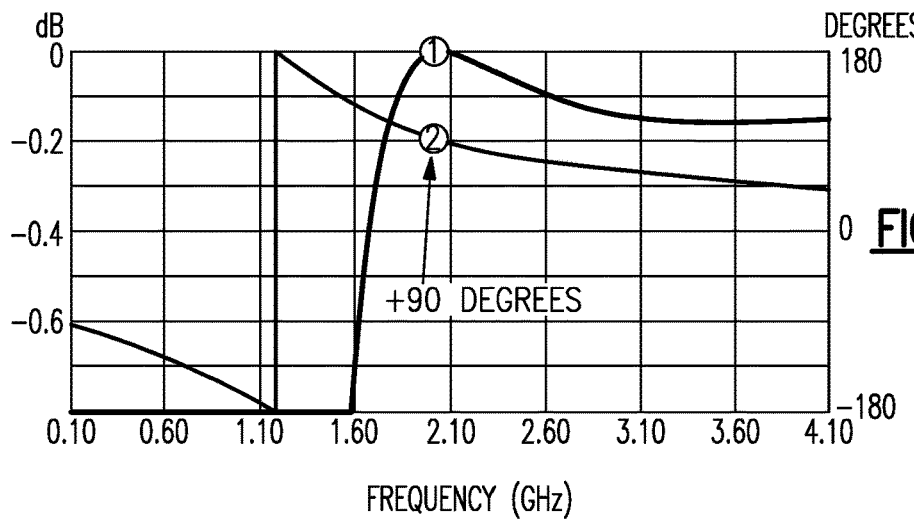
FIG. 32C shows an example phase shift associated with the HPF of FIG. 32A.

Similarly, and referring to the 3-pole HPF of FIGS. 30 and 32A in the context of the example B4 band, FIG. 32C shows the foregoing response curve on the B4 path superimposed with a phase angle plot. One can see that at the B4 band, the phase angle has a value of approximately +90 degrees.

Figure 33:
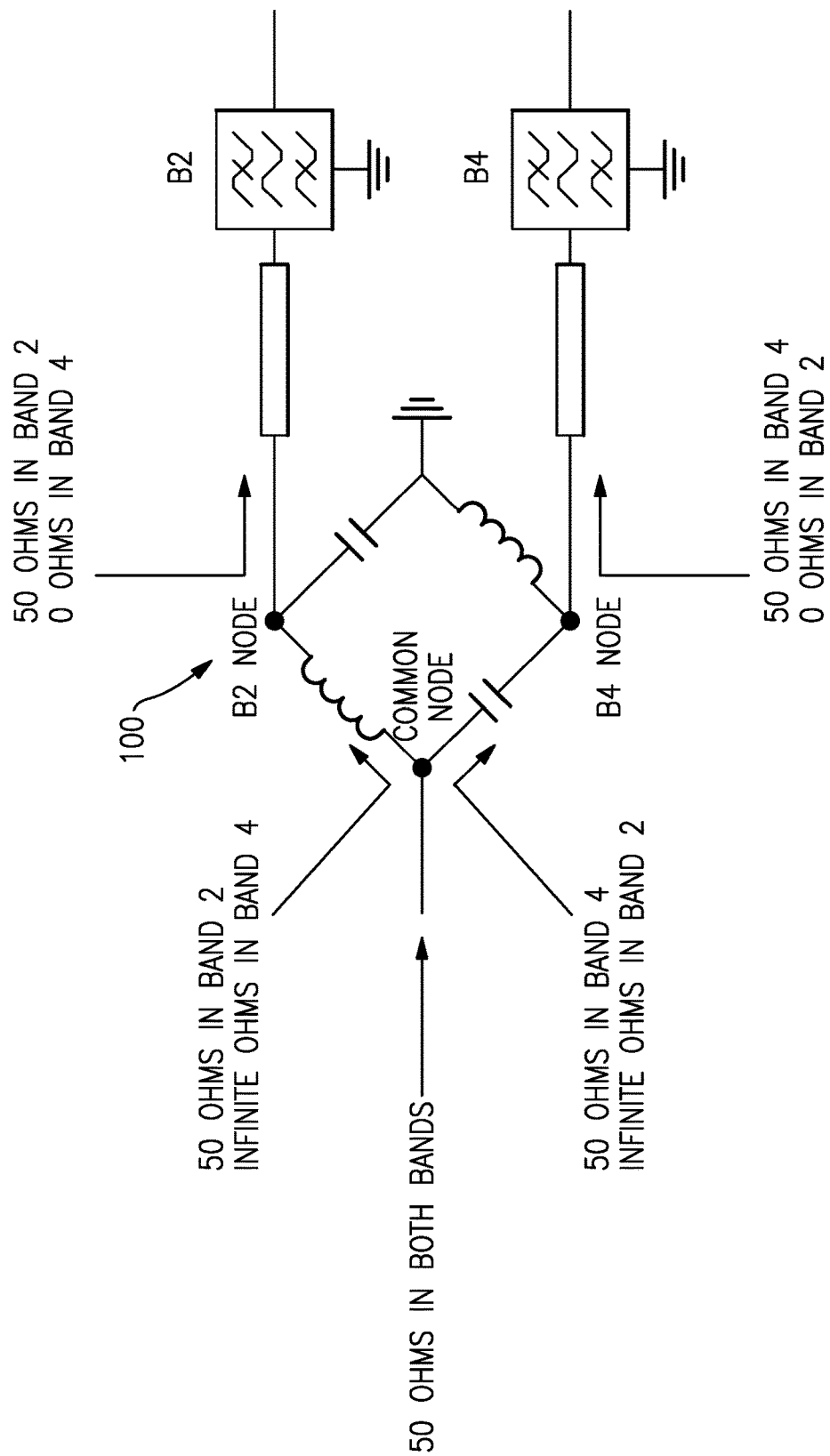
FIG. 33 shows an example of how the LPF and HPF functionalities of FIGS. 31 and 32 can yield a desired CA functionality at a common node of the CA circuit.

FIG. 33 shows an example of how the foregoing LPF and HPF functionalities can yield a desired CA functionality at the common node of the CA circuit 100. At each of the B2 node and the B4 node, the in-band impedance is matched (e.g., 50 Ohms), and the opposite-band impedance is approximately zero Ohms, as described herein. It is noted that the CA circuit 100 transforms each opposite-band impedance to infinity or sufficiently large value at the common node. Accordingly, the two paths (e.g., B2 and B4 paths) can be connected together at the common node to provide desired CA functionalities as described herein.

Figure 34:
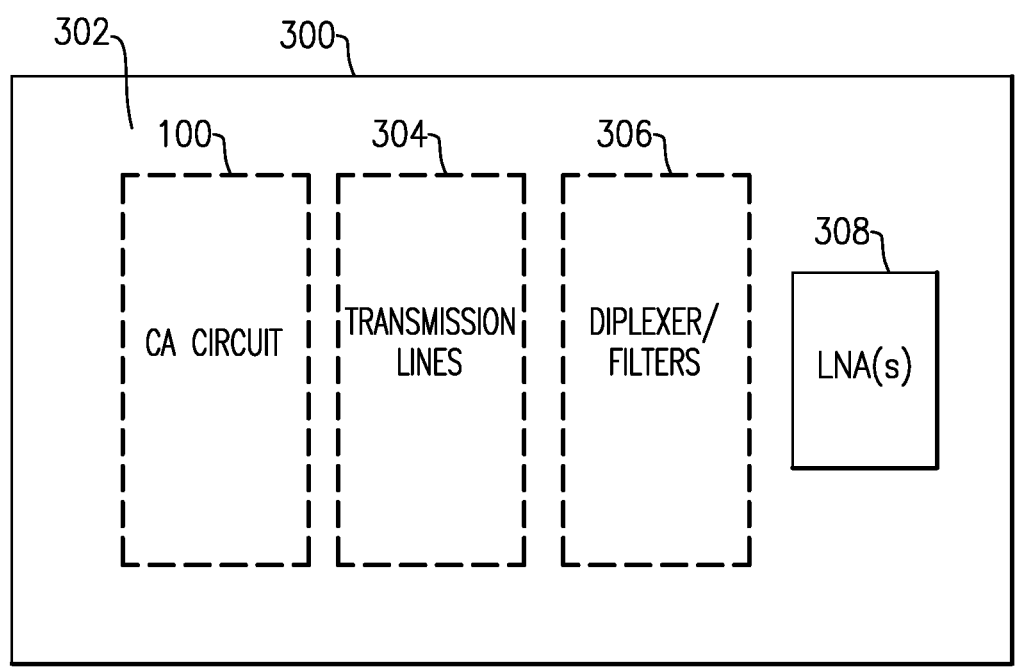
FIG. 34 shows a block diagram of an RF module having one or more features as described herein.

FIG. 34 shows a block diagram of an RF module 300 (e.g., a front-end module or an LNA module) having one or more features as described herein. The module 300 can include a packaging substrate 302 such as a laminate substrate. Such a module can include one or more LNAs 308. At least one of such LNAs can be configured to operate in a CA mode as described herein.

The module 300 can further include a CA circuit 100 having one or more features as described herein. Such a CA circuit can be configured to provide CA functionality for the LNA 308 through a diplexer/filter assembly 306. Transmission lines 304 can be configured to, for example, provide desired phase shifts in various signal paths, including those associated with inputs and output(s) of the diplexer/filter assembly 306. Although not shown, the module 300 can further include grounding switches for the CA circuit 100 to facilitate CA and non-CA operations as described herein.

In some implementations, an architecture, device and/or circuit having one or more features described herein can be included in an RF device such as a wireless device. Such an architecture, device and/or circuit can be implemented directly in the wireless device, in one or more modular forms as described herein, or in some combination thereof. In some embodiments, such a wireless device can include, for example, a cellular phone, a smart-phone, a hand-held wireless device with or without phone functionality, a wireless tablet, a wireless router, a wireless access point, a wireless base station, etc. Although described in the context of wireless devices, it will be understood that one or more features of the present disclosure can also be implemented in other RF systems such as base stations.

Figure 35:
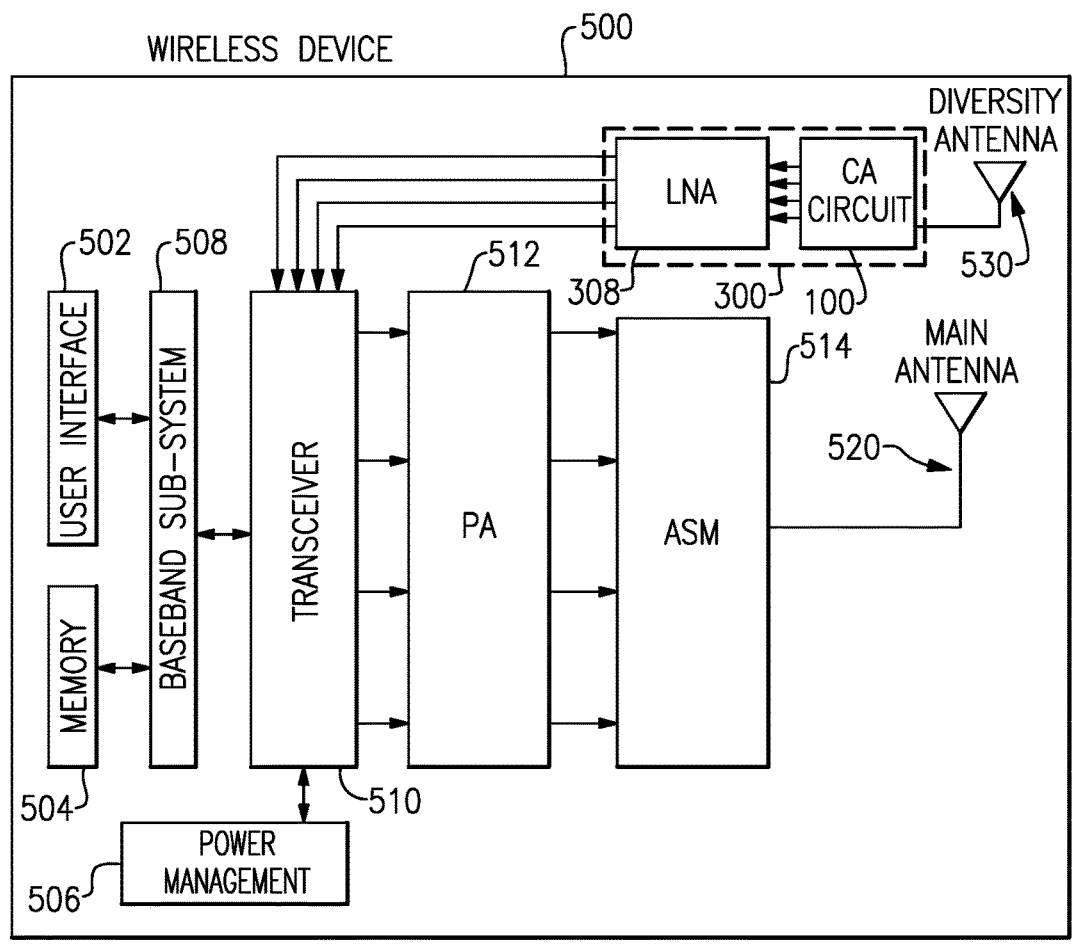
FIG. 35 depicts an example wireless device having one or more advantageous features described herein.

FIG. 35 depicts an example wireless device 500 having one or more advantageous features described herein. In some embodiments, such advantageous features can be implemented in a front-end (FE) or LNA module 300 as described herein. Such a module can include a CA circuit 100 having one or more features as described herein. In some embodiments, such module can include more or less components than as indicated by the dashed box.

PAs in a PA module 512 can receive their respective RF signals from a transceiver 510 that can be configured and operated to generate RF signals to be amplified and transmitted, and to process received signals. The transceiver 510 is shown to interact with a baseband sub-system 508 that is configured to provide conversion between data and/or voice signals suitable for a user and RF signals suitable for the transceiver 510. The transceiver 510 is also shown to be connected to a power management component 506 that is configured to manage power for the operation of the wireless device 500. Such power management can also control operations of the baseband sub-system 508 and other components of the wireless device 500.

The baseband sub-system 508 is shown to be connected to a user interface 502 to facilitate various input and output of voice and/or data provided to and received from the user. The baseband sub-system 508 can also be connected to a memory 504 that is configured to store data and/or instructions to facilitate the operation of the wireless device, and/or to provide storage of information for the user.

In the example wireless device 500, the module 300 can include one or more carrier aggregation-capable signal paths configured to provide one or more functionalities as described herein. In some embodiments, at least some of the signals received through a diversity antenna 530 can be routed to one or more low-noise amplifiers (LNAs) 308 through such carrier aggregation-capable signal path(s). Amplified signals from the LNAs 308 are shown to be routed to the transceiver 510.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

One or more features of the present disclosure can be implemented with various cellular frequency bands as described herein. Examples of such bands are listed in Table 3. It will be understood that at least some of the bands can be divided into sub-bands. It will also be understood that one or more features of the present disclosure can be implemented with frequency ranges that do not have designations such as the examples of Table 3.

TABLE 3

| Band | Mode | Tx Frequency Range (MHz) | Rx Frequency Range (MHz) |
| --- | --- | --- | --- |
| B1  | FDD | 1,920-1,980     | 2,110-2,170     |
| B2  | FDD | 1,850-1,910     | 1,930-1,990     |
| B3  | FDD | 1,710-1,785     | 1,805-1,880     |
| B4  | FDD | 1,710-1,755     | 2,110-2,155     |
| B5  | FDD | 824-849         | 869-894         |
| B6  | FDD | 830-840         | 875-885         |
| B7  | FDD | 2,500-2,570     | 2,620-2,690     |
| B8  | FDD | 880-915         | 925-960         |
| B9  | FDD | 1,749.9-1,784.9 | 1,844.9-1,879.9 |
| B10 | FDD | 1,710-1,770     | 2,110-2,170     |
| B11 | FDD | 1,427.9-1,447.9 | 1,475.9-1,495.9 |
| B12 | FDD | 699-716         | 729-746         |

TABLE 3-continued

| Band | Mode | Tx Frequency Range (MHz) | Rx Frequency Range (MHz) |
|---|---|---|---|
| B13 | FDD | 777-787 | 746-756 |
| B14 | FDD | 788-798 | 758-768 |
| B15 | FDD | 1,900-1,920 | 2,600-2,620 |
| B16 | FDD | 2,010-2,025 | 2,585-2,600 |
| B17 | FDD | 704-716 | 734-746 |
| B18 | FDD | 815-830 | 860-875 |
| B19 | FDD | 830-845 | 875-890 |
| B20 | FDD | 832-862 | 791-821 |
| B21 | FDD | 1,447.9-1,462.9 | 1,495.9-1,510.9 |
| B22 | FDD | 3,410-3,490 | 3,510-3,590 |
| B23 | FDD | 2,000-2,020 | 2,180-2,200 |
| B24 | FDD | 1,626.5-1,660.5 | 1,525-1,559 |
| B25 | FDD | 1,850-1,915 | 1,930-1,995 |
| B26 | FDD | 814-849 | 859-894 |
| B27 | FDD | 807-824 | 852-869 |
| B28 | FDD | 703-748 | 758-803 |
| B29 | FDD | N/A | 716-728 |
| B30 | FDD | 2,305-2,315 | 2,350-2,360 |
| B31 | FDD | 452.5-457.5 | 462.5-467.5 |
| B33 | TDD | 1,900-1,920 | 1,900-1,920 |
| B34 | TDD | 2,010-2,025 | 2,010-2,025 |
| B35 | TDD | 1,850-1,910 | 1,850-1,910 |
| B36 | TDD | 1,930-1,990 | 1,930-1,990 |
| B37 | TDD | 1,910-1,930 | 1,910-1,930 |
| B38 | TDD | 2,570-2,620 | 2,570-2,620 |
| B39 | TDD | 1,880-1,920 | 1,880-1,920 |
| B40 | TDD | 2,300-2,400 | 2,300-2,400 |
| B41 | TDD | 2,496-2,690 | 2,496-2,690 |
| B42 | TDD | 3,400-3,600 | 3,400-3,600 |
| B43 | TDD | 3,600-3,800 | 3,600-3,800 |
| B44 | TDD | 703-803 | 703-803 |

It is noted that while various examples are described herein in the context of carrier aggregation of two or three bands, one or more features of the present disclosure can also be implemented in configurations involving carrier aggregation of different numbers of bands.

It will be understood that an RF circuit having one or more features as described herein can be referred to as a Domino circuit, a Domino bridge, etc. For example, a coupling circuit (e.g., 100 in FIG. 1), a carrier-aggregation (CA) circuit (e.g., 100 in FIG. 2), or any combination thereof, can be referred to as an RF circuit, a bridge circuit, a Domino circuit, a Domino bridge, or any combination thereof. In another example, such an RF circuit, a bridge circuit, a Domino circuit, a Domino bridge, or any combination thereof, can include either or both of first and second signal paths coupled to their respective nodes so as to provide impedance properties as described herein, and such combinations can also be referred to as an RF circuit, a bridge circuit, a Domino circuit, a Domino bridge, or any combination thereof.

Various examples related to the foregoing RF circuit, bridge circuit, Domino circuit, Domino bridge, or any combination thereof, are described herein as being implemented with inductances and capacitances (e.g., as in FIGS. 3, 15-17, 24-26, 30 and 33). It will be understood that other configurations that yield similar impedance properties as described herein can also be implemented.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency circuit comprising:
 a first signal path configured to present an approximately zero impedance to a first out-of-band signal that is out of a first frequency band; and
 a coupling circuit coupled to the first signal path and configured such that the approximately zero impedance presented by the first signal path to the first out-of-band signal results in the first out-of-band signal being substantially excluded from the first signal path.

2. The radio-frequency circuit of claim 1 further comprising a second signal path configured to present an approximately zero impedance to a second out-of-band signal that is out of a second frequency band.

3. The radio-frequency circuit of claim 2 wherein the coupling circuit is further configured such that the approximately zero impedance presented by the second signal path to the second out-of-band signal results in the second out-of-band signal being substantially excluded from the second signal path.

4. The radio-frequency circuit of claim 3 wherein the second out-of-band signal includes a first in-band signal associated with the first frequency band, and the first outof-band signal includes a second in-band signal associated with the second frequency band.

5. The radio-frequency circuit of claim 4 wherein the first and second frequency bands are frequency bands suitable for carrier aggregation.

6. The radio-frequency circuit of claim 5 wherein the first and second frequency bands are cellular receive bands suitable for carrier aggregation.

7. The radio-frequency circuit of claim 4 wherein each of the first and second signal paths is further configured to present a matched impedance for the corresponding in-band signal.

8. The radio-frequency circuit of claim 7 wherein the coupling circuit is further configured such that the matched impedance of each of the first and second signal paths results in the corresponding in-band signal to be included in the respective signal path.

9. The radio-frequency circuit of claim 4 wherein the radio-frequency circuit is configured for carrier aggregation of a received signal having portions in both of the first and second frequency bands.

10. The radio-frequency circuit of claim 9 wherein each of the first and second signal paths includes a filter and a transmission line.

11. The radio-frequency circuit of claim 10 wherein the coupling circuit is implemented to provide a common input node for the first and second signal paths, the coupling circuit including a first node such that the transmission line of the first signal path is between the first node and the respective filter, the coupling circuit further including a second node such that the transmission line of the second signal path is between the second node and the respective filter.

12. The radio-frequency circuit of claim 11 wherein the coupling circuit includes a first LC circuit and a second LC circuit that couple the common input node to a ground in a parallel manner, the first LC circuit including a first inductance L1 and a first capacitance C1 in series, the second LC circuit including a second capacitance C2 and a second inductance L2 in series, the first node between the first inductance L1 and the first capacitance C1, the second node between the second capacitance C2 and the second inductance L2.

13. The radio-frequency circuit of claim 10 wherein the coupling circuit implemented to provide a common output node for the first and second signal paths, the coupling circuit including a first node such that the transmission line of the first signal path is between the first node and the respective filter, the coupling circuit further including a second node such that the transmission line of the second signal path is between the second node and the respective filter.

14. The radio-frequency circuit of claim 13 wherein the coupling circuit includes a first LC circuit and a second LC circuit that couple the common output node to a ground in a parallel manner, the first LC circuit including a first inductance L1 and a first capacitance C1 in series, the second LC circuit including a second capacitance C2 and a second inductance L2 in series, the first node between the first inductance L1 and the first capacitance C1, the second node between the second capacitance C2 and the second inductance L2.

15. The radio-frequency circuit of claim 10 further comprising a first grounding switch between a ground and a node at an input or output of the first signal path, and a second grounding switch between the ground and a node at an input or output of the second signal path.

16. The radio-frequency circuit of claim 15 wherein each of the first and second grounding switches is open for a carrier aggregation mode of operation.

17. The radio-frequency circuit of claim 15 wherein the first grounding switch is open and the second grounding switch is closed for a non-carrier aggregation operation in the first frequency band, and the second grounding switch is open and the first grounding switch is closed for a non-carrier aggregation operation in the second frequency band.

18. A method for processing signals, the method comprising:
providing a first signal path that presents an approximately zero impedance to a first out-of-band signal that is out of a first frequency band; and
substantially excluding the first out-of-band signal from the first signal path with a coupling circuit coupled to the first signal path.

19. A circuit comprising:
an inductance between a common node and a first node;
a capacitance between the common node and a second node;
a capacitance between the first node and a ground node; and
an inductance between the second node and the ground node, the inductances and the capacitances selected such that a first out-of-band signal that is out of a first frequency band is substantially excluded from the first signal path that presents a low impedance to the first out-of-band signal, when the first signal path is connected to the first node.

20. The circuit of claim 19 wherein the first signal path includes a transmission line having a tendency to rotate a high out-of-band impedance of a component along the first signal path to a low impedance.

* * * * *